(12) United States Patent
Jeon et al.

(10) Patent No.: US 8,426,939 B2
(45) Date of Patent: Apr. 23, 2013

(54) SEMICONDUCTOR DEVICE AND METHOD FOR MANUFACTURING OF THE SAME

(75) Inventors: Woo Chul Jeon, Suwon-si (KR); Jung Hee Lee, Daegu-si (KR); Young Hwan Park, Seoul (KR); Ki Yeol Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 403 days.

(21) Appl. No.: 12/654,935

(22) Filed: Jan. 8, 2010

(65) Prior Publication Data

US 2011/0057286 A1    Mar. 10, 2011

(30) Foreign Application Priority Data

Sep. 8, 2009   (KR) .................. 10-2009-0084599

(51) Int. Cl.
*H01L 29/739* (2006.01)
(52) U.S. Cl.
USPC ........... 257/471; 257/485; 257/162; 257/141; 257/343; 257/459; 257/452; 257/476; 257/478; 257/194; 257/183
(58) Field of Classification Search ............ 257/471, 257/485, 162, 141, 343, E27.04, E29.014, 257/E33.065–E33.068, E33.051, E51.009, 257/459, 452, 476, 478, 194, 183, E29.012, 257/E31.074
See application file for complete search history.

(56) References Cited

U.S. PATENT DOCUMENTS

| | | | | |
|---|---|---|---|---|
| 7,898,044 B2* | 3/2011 | Nakatani et al. | ............... | 257/414 |
| 2003/0098462 A1* | 5/2003 | Yoshida | ......................... | 257/183 |
| 2007/0075332 A1* | 4/2007 | Tokuda et al. | ................. | 257/153 |
| 2011/0057286 A1* | 3/2011 | Jeon et al. | ...................... | 257/476 |
| 2011/0088456 A1* | 4/2011 | Ren et al. | ...................... | 73/31.06 |

FOREIGN PATENT DOCUMENTS

| JP | 05-283672 | 10/1993 |
|---|---|---|
| KR | 10-2003-0010553 | 2/2003 |

OTHER PUBLICATIONS

Korean Office Action issued Jul. 29, 2011 in corresponding Korean Patent Application No. 10-2009-0084599.

* cited by examiner

*Primary Examiner* — Michael Shingleton

(57) ABSTRACT

The present invention provides a semiconductor device including: a base substrate; a first semiconductor layer which is disposed on the base substrate and has a front surface and a rear surface opposite to the front surface; first ohmic electrodes disposed on the front surface of the first semiconductor layer; a second ohmic electrode disposed on the rear surface of the first semiconductor layer; a second semiconductor layer interposed between the first semiconductor layer and the first ohmic electrodes; and a Schottky electrode part which covers the first ohmic electrodes on the front surface of the first semiconductor layer.

11 Claims, 16 Drawing Sheets

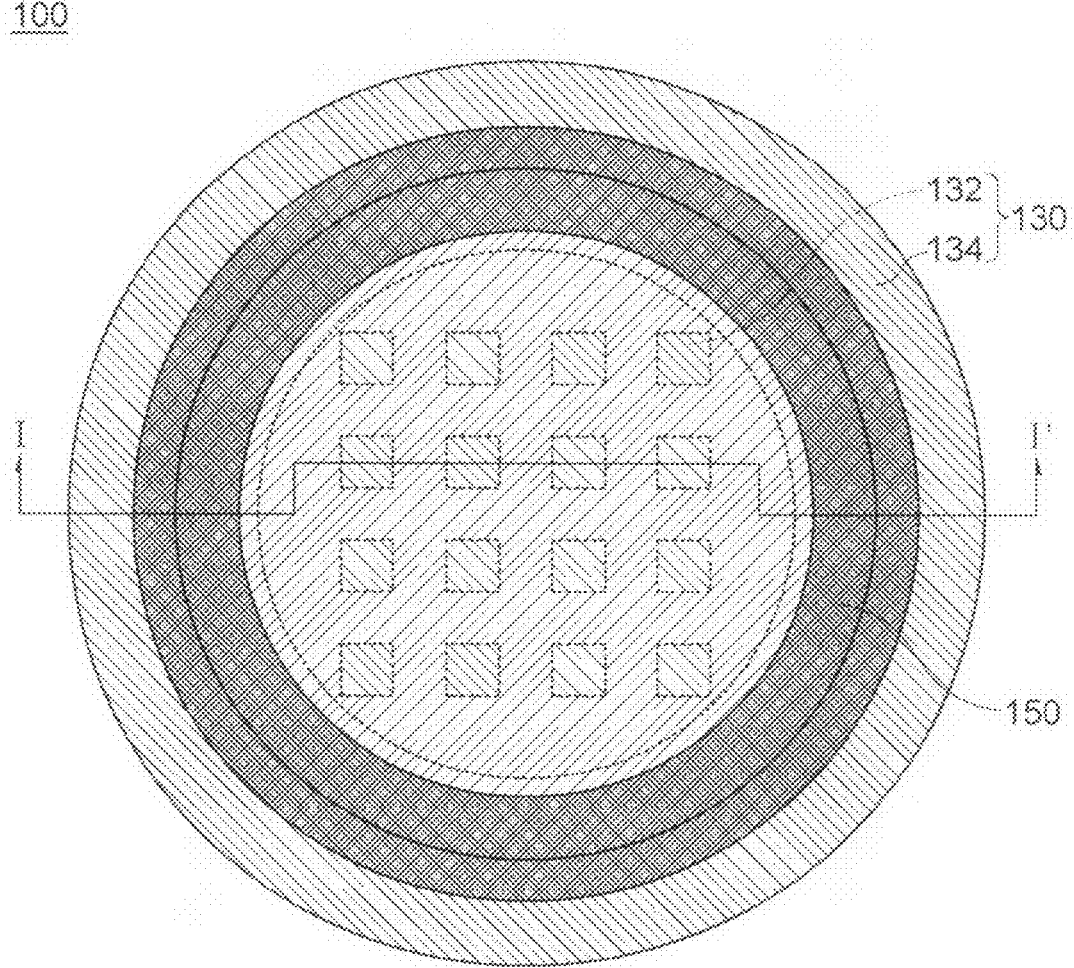
[FIG. 1]
100

[FIG. 2]
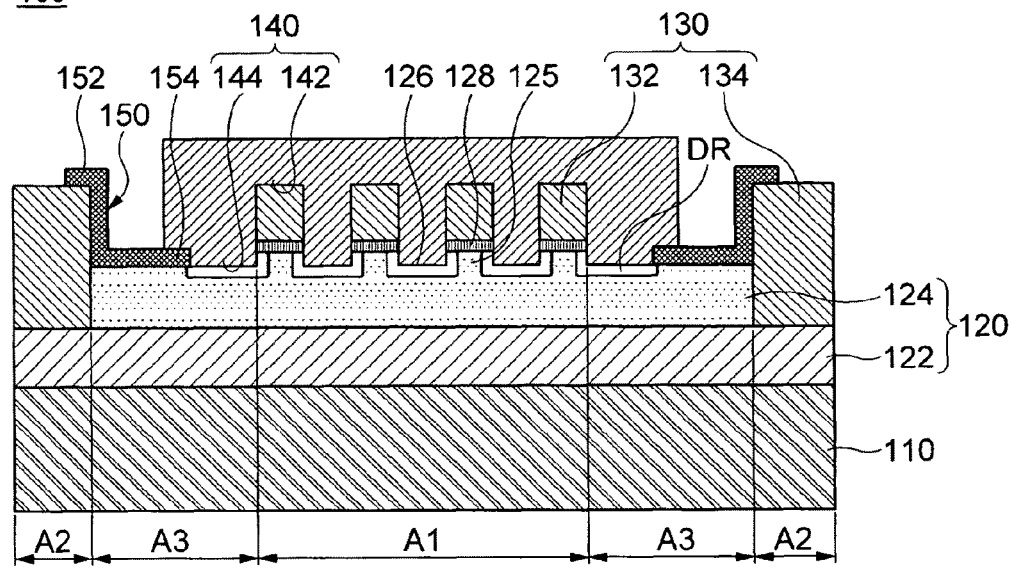
[FIG. 3A]
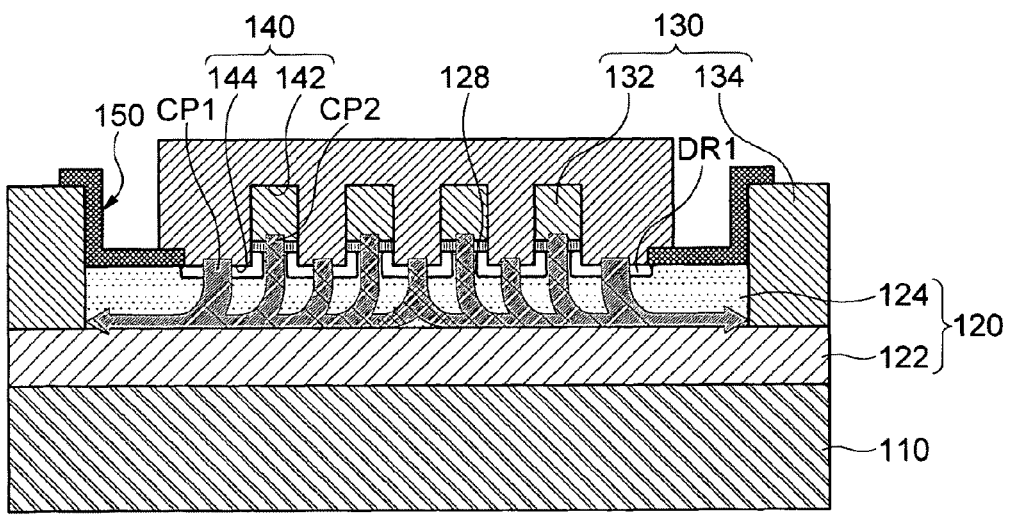

[FIG. 3B]
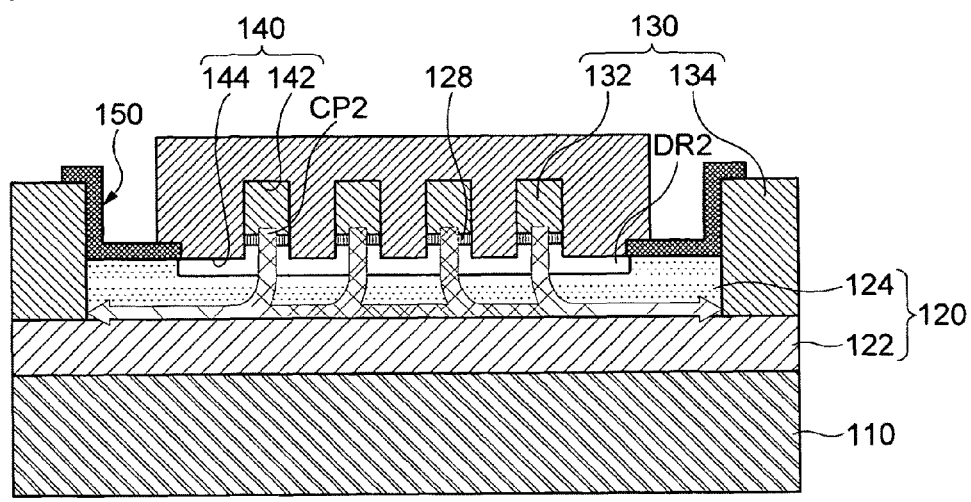
[FIG. 3C]
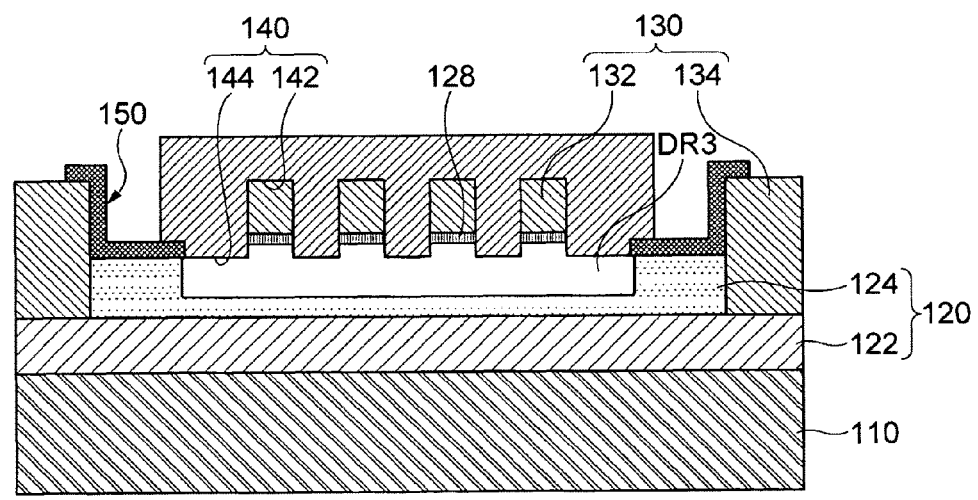

[FIG. 4A]
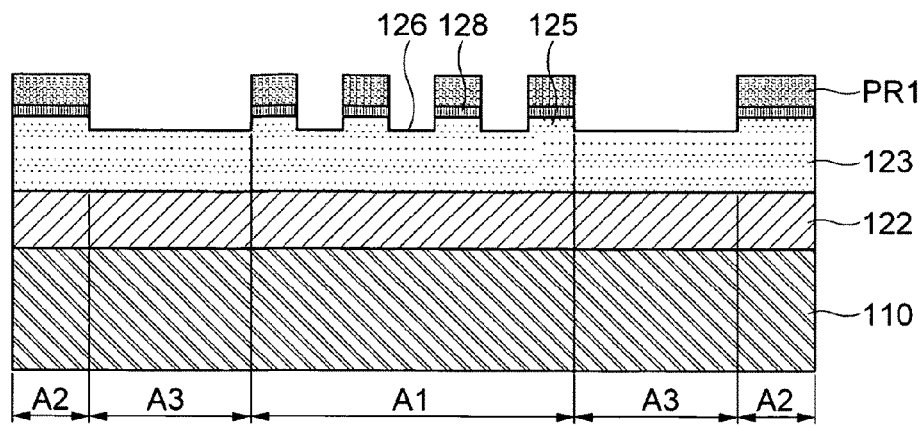
[FIG. 4B]
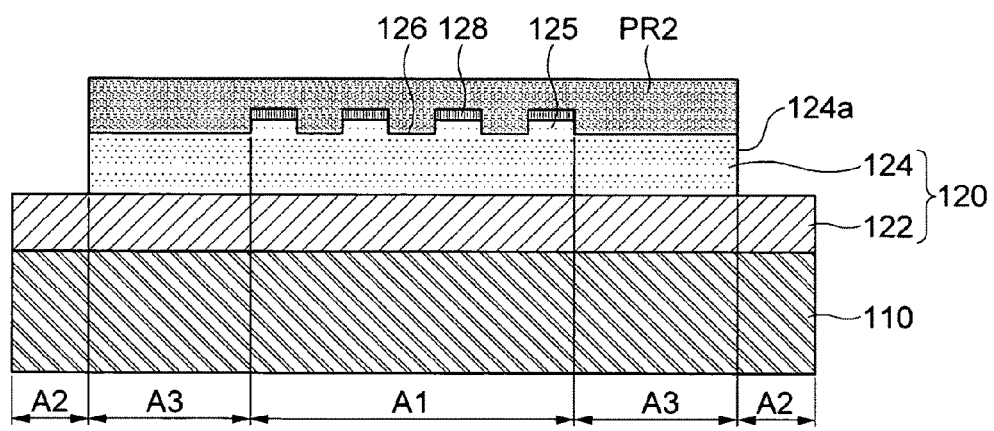

[FIG. 4C]
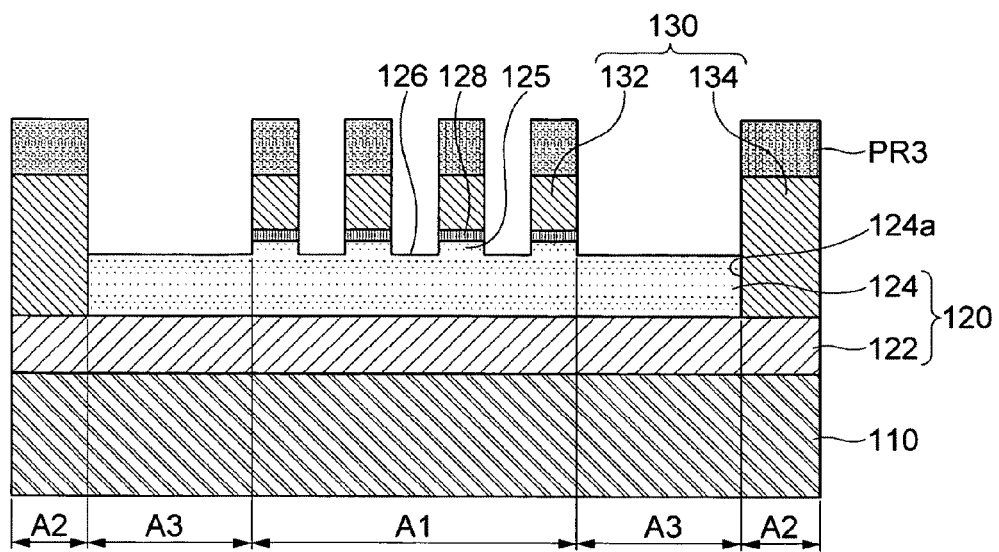
[FIG. 4D]
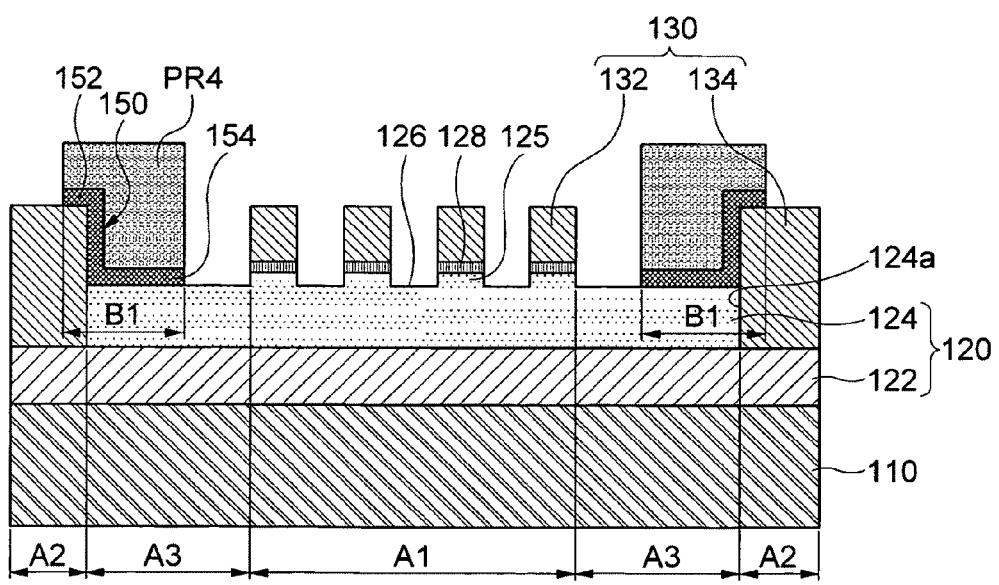

[FIG. 4E]
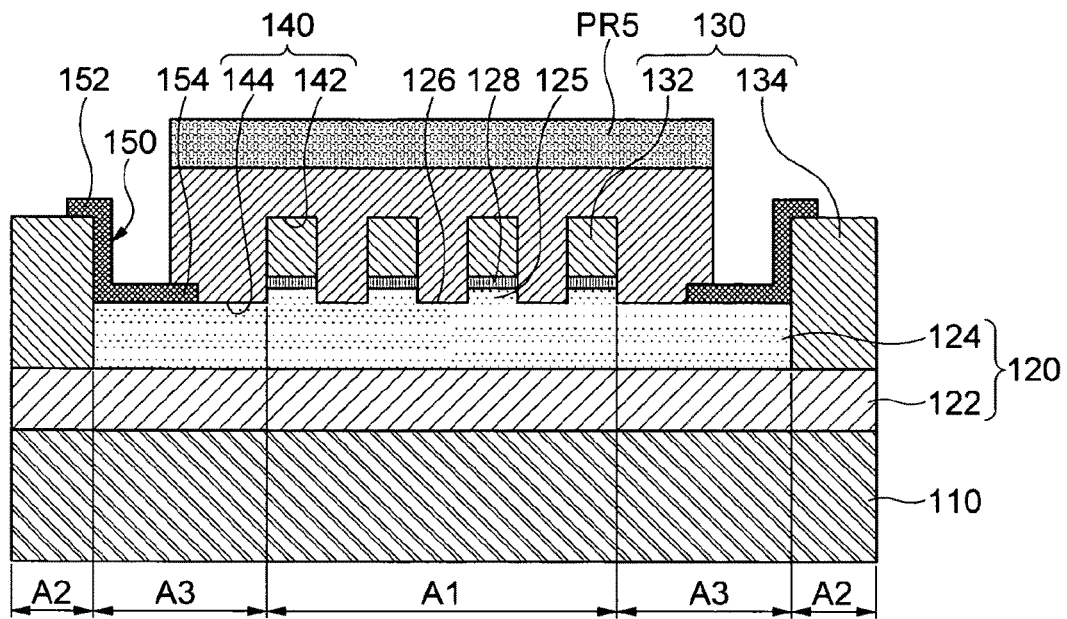
[FIG. 5]
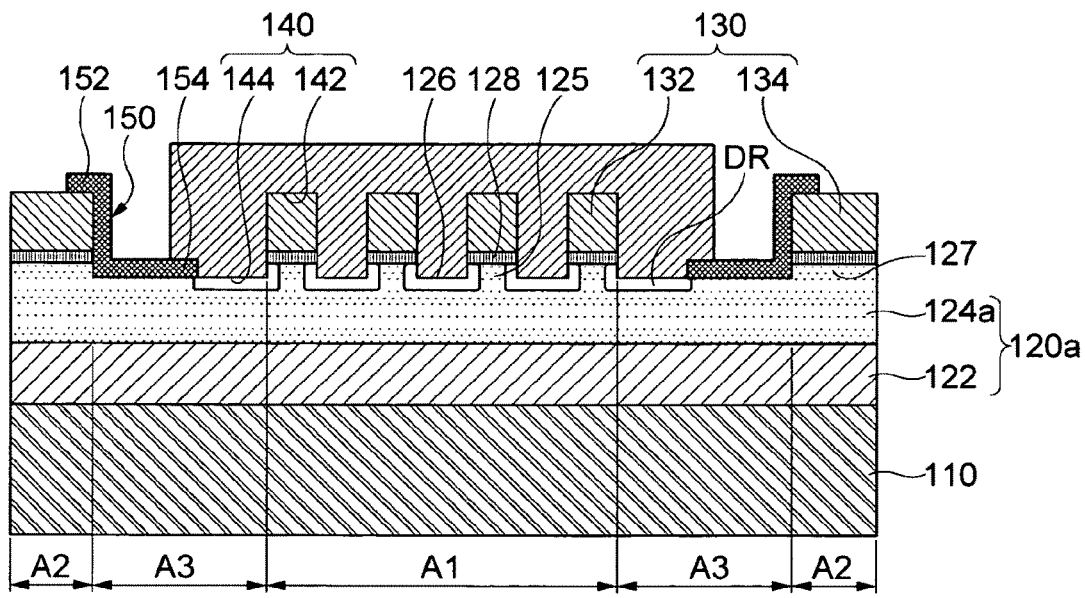

[FIG. 6]
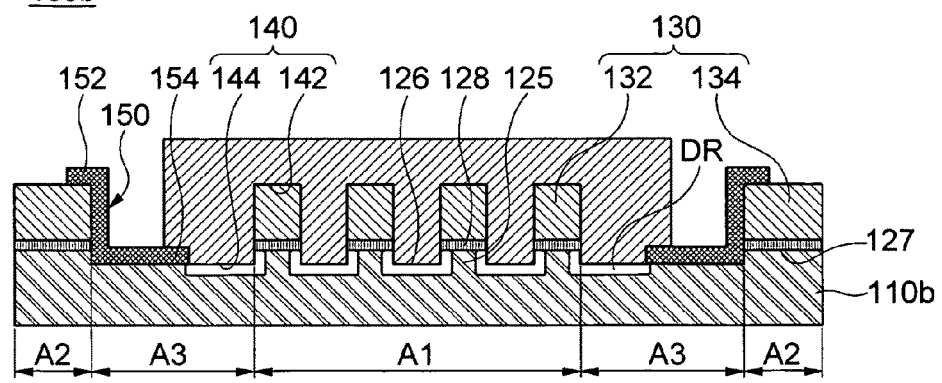
[FIG. 7]
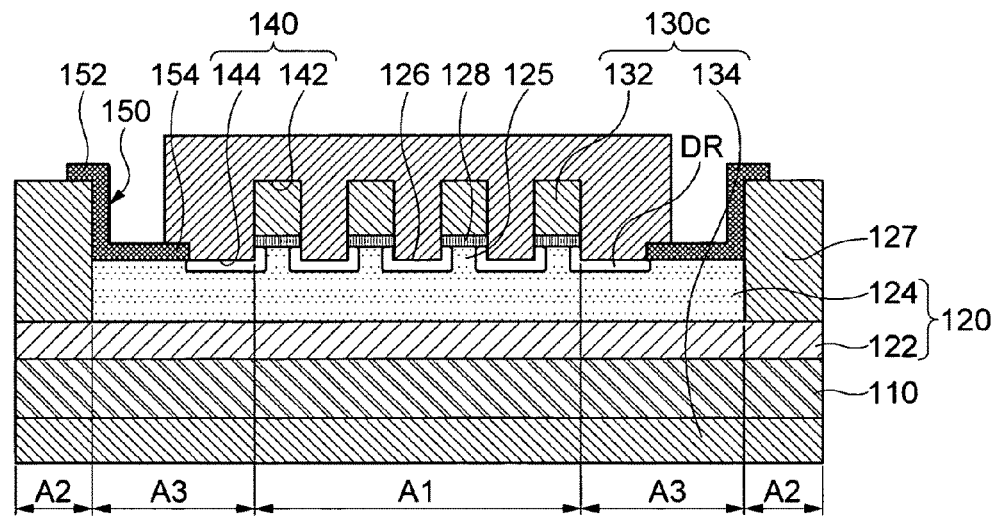

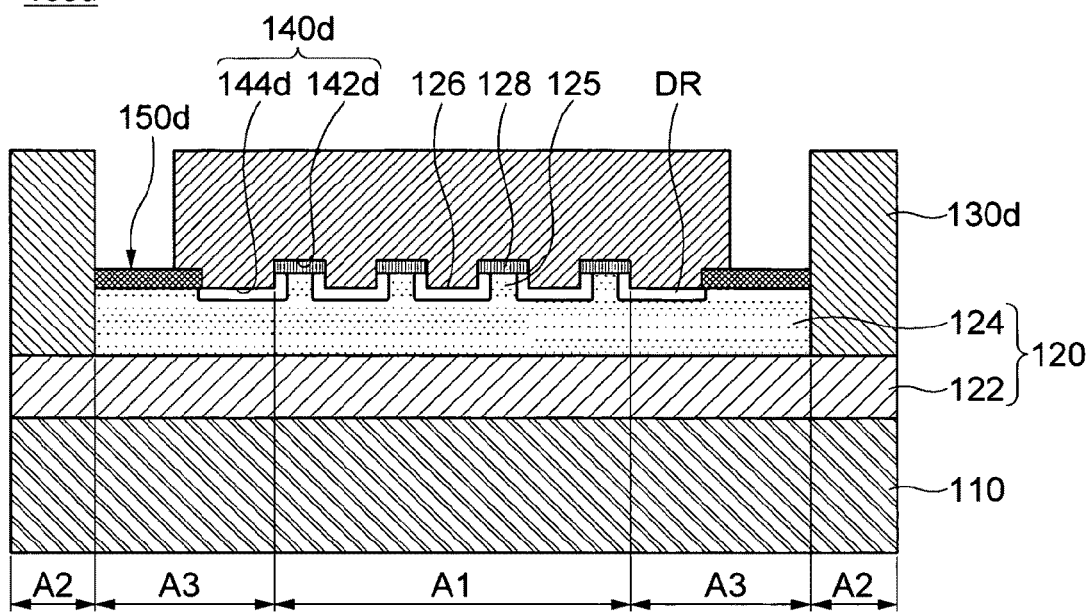

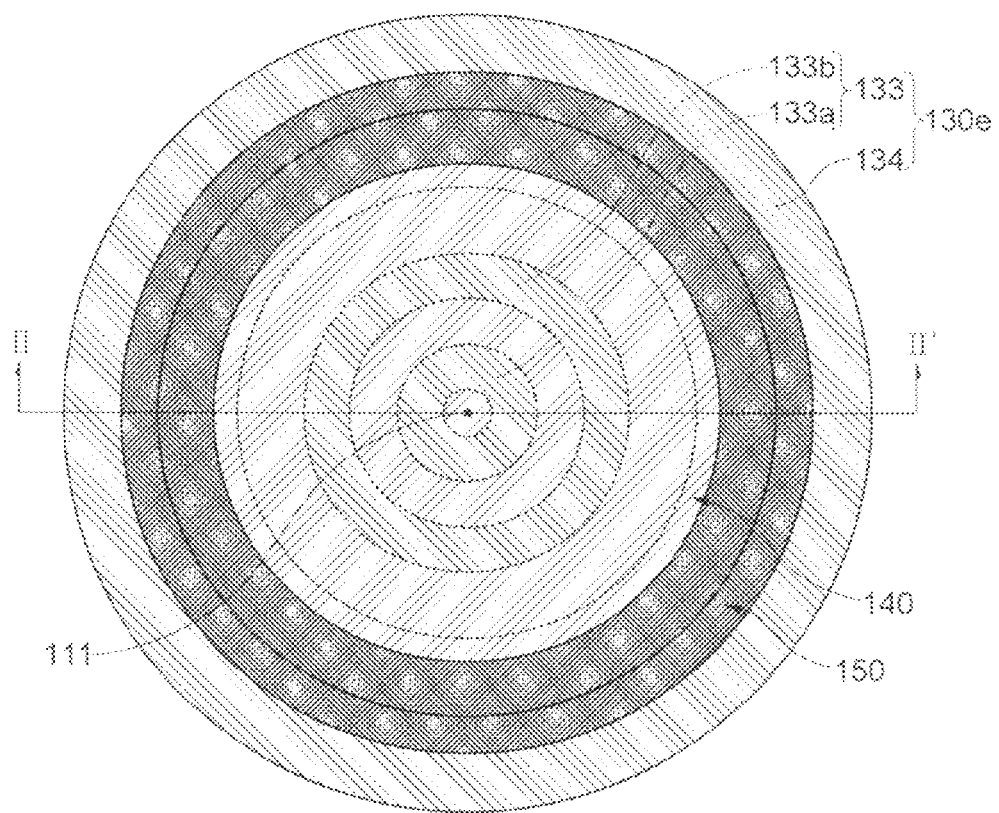

[FIG. 10]
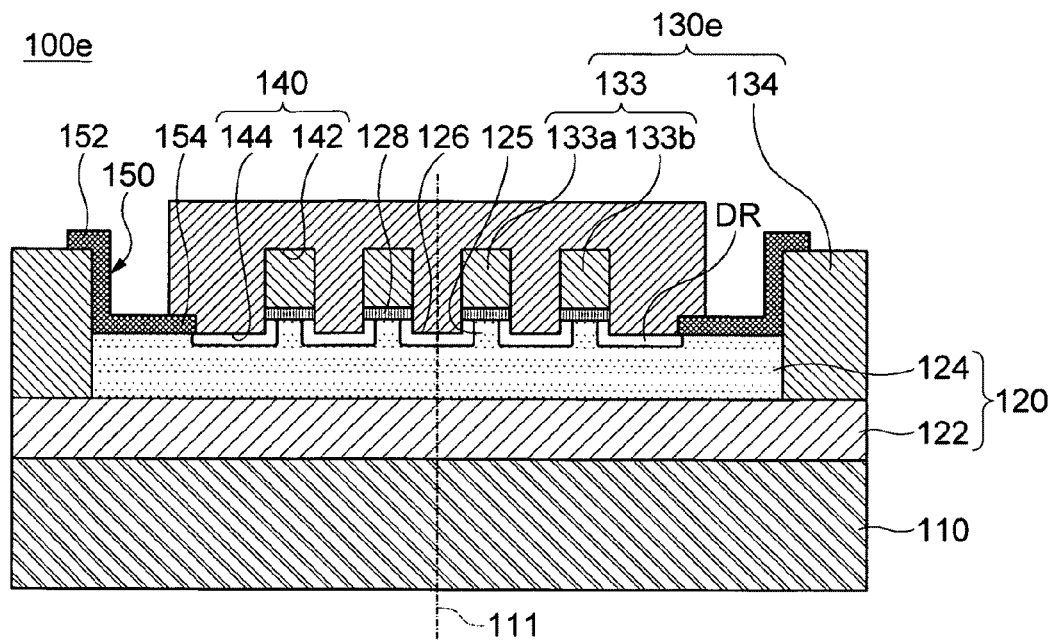
[FIG. 11]
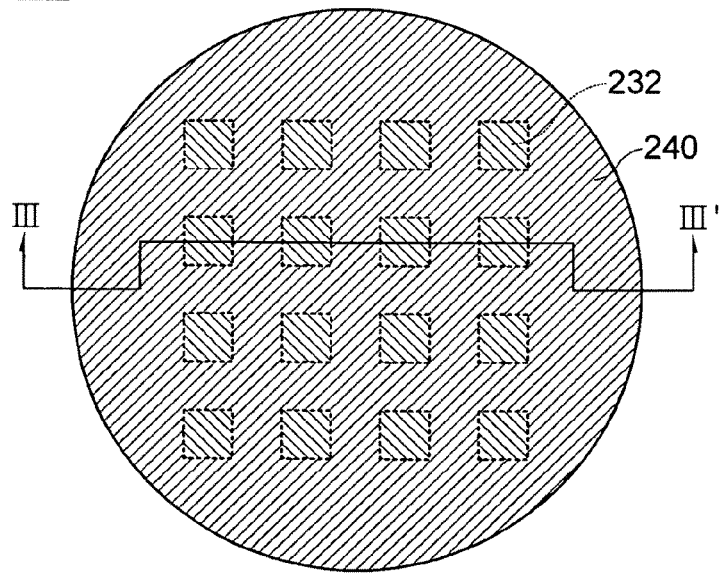

[FIG. 12]
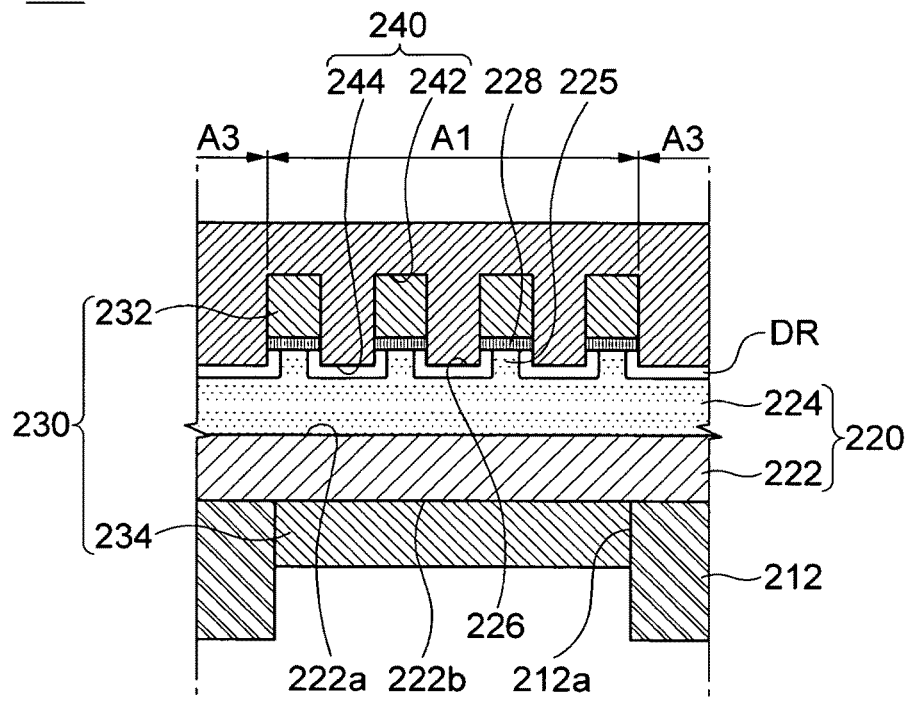
[FIG. 13A]
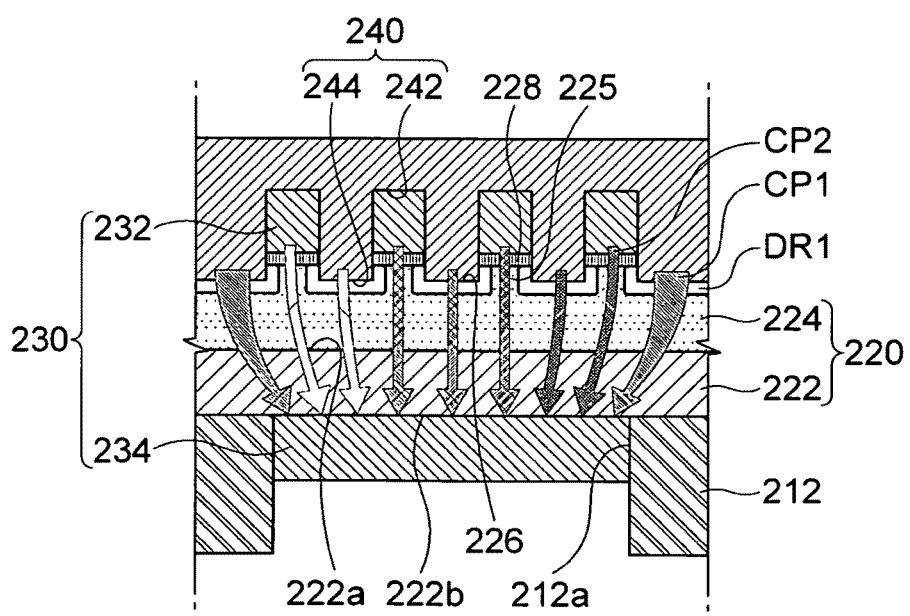

[FIG. 13B]
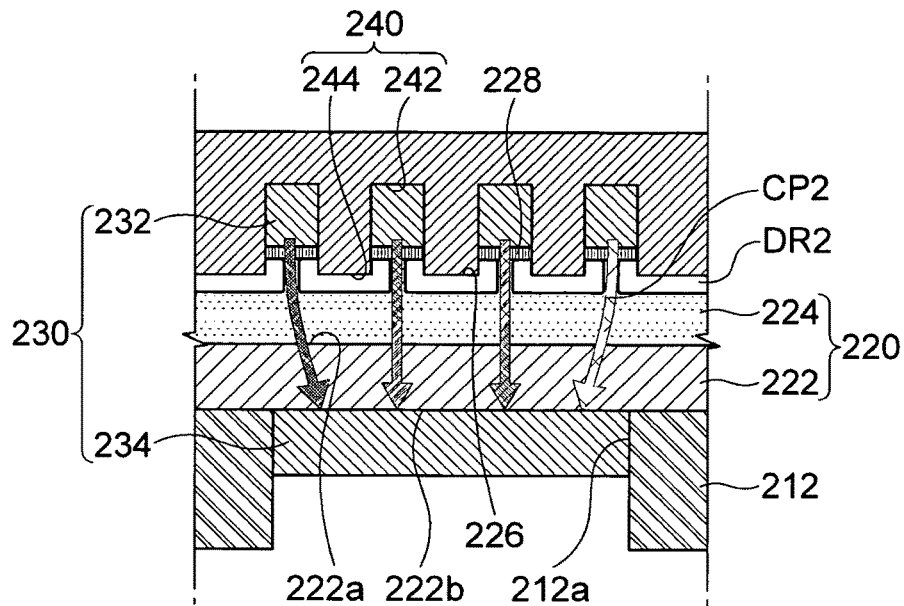
[FIG. 13C]
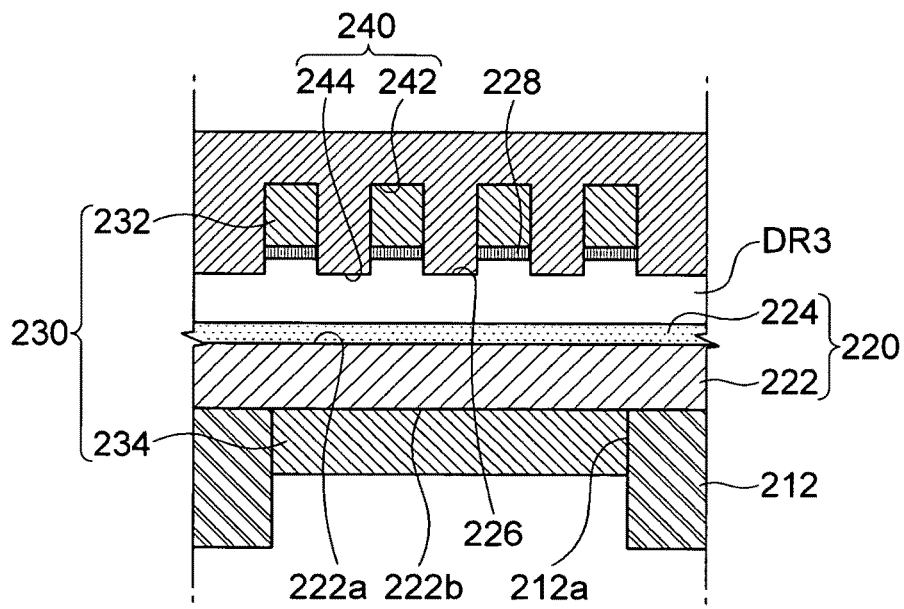

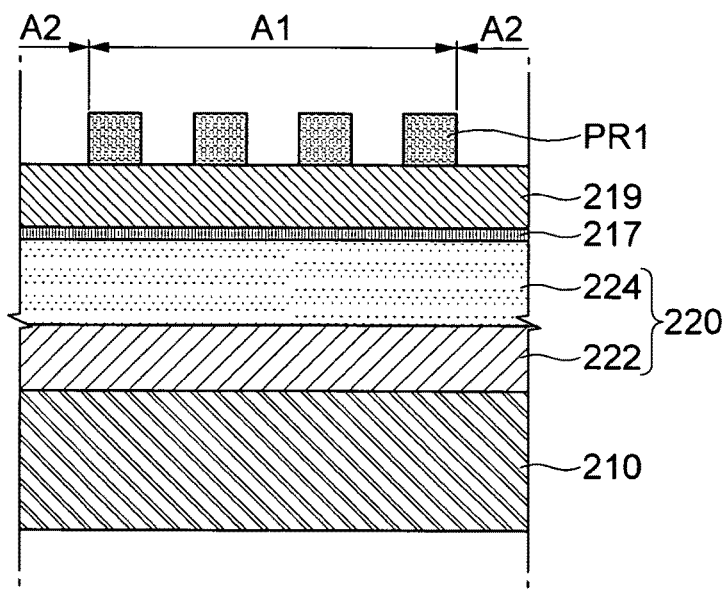
[FIG. 14A]
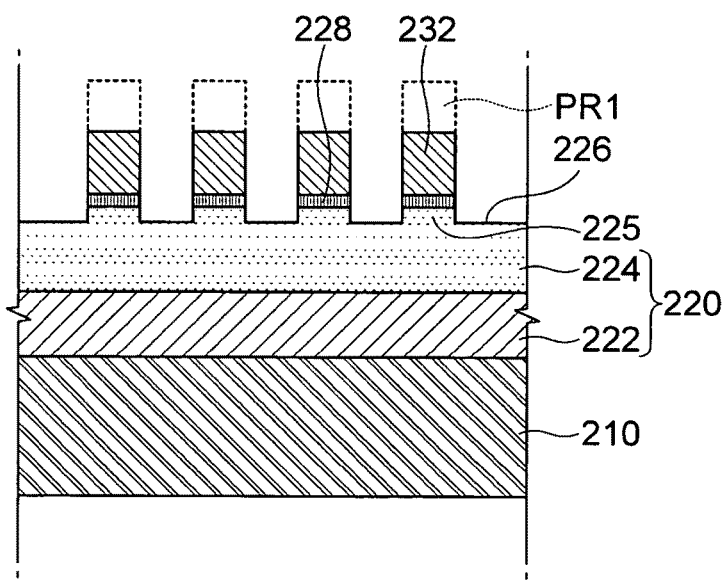
[FIG. 14B]

[FIG. 14C]
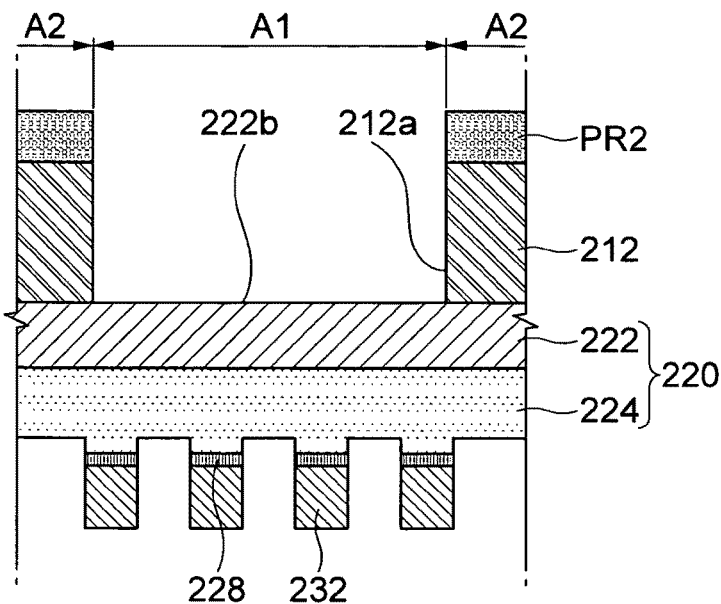
[FIG. 14D]
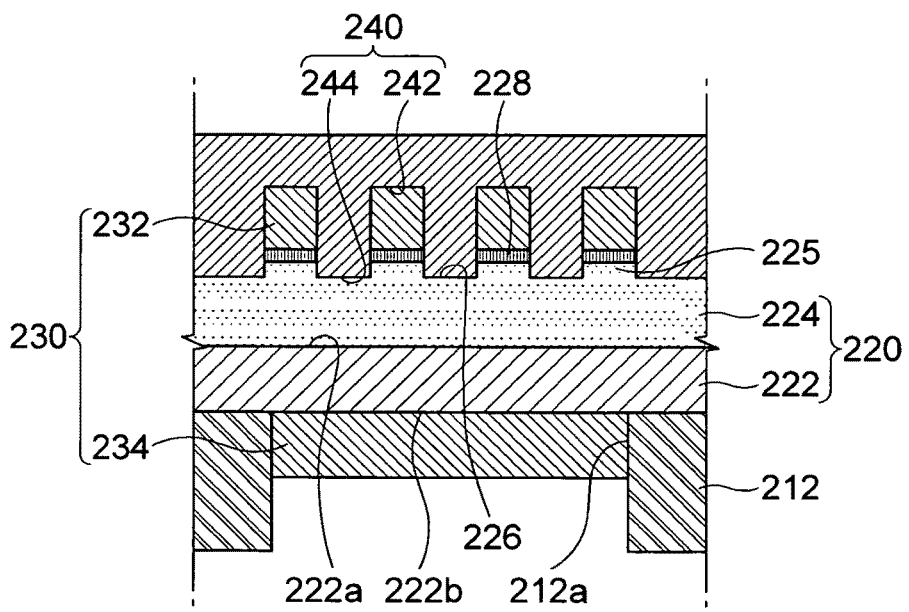

[FIG. 15]
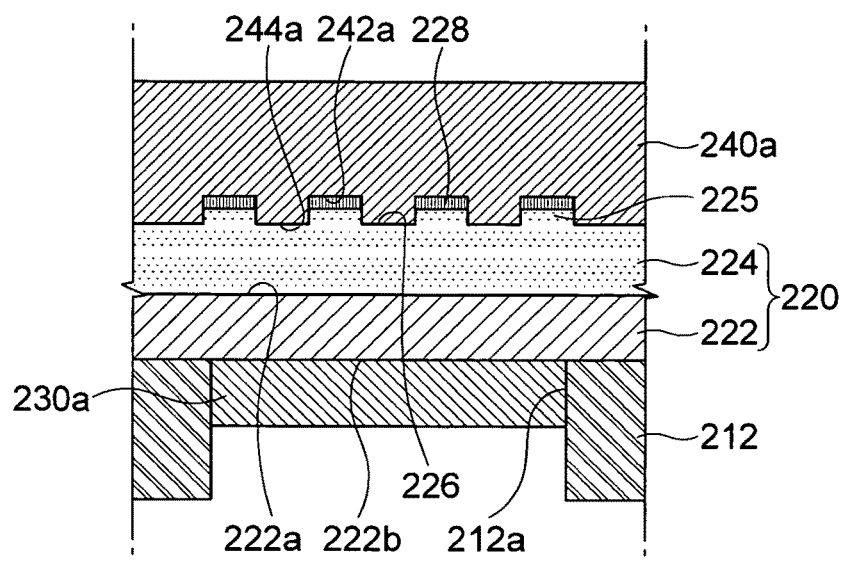
[FIG. 16]
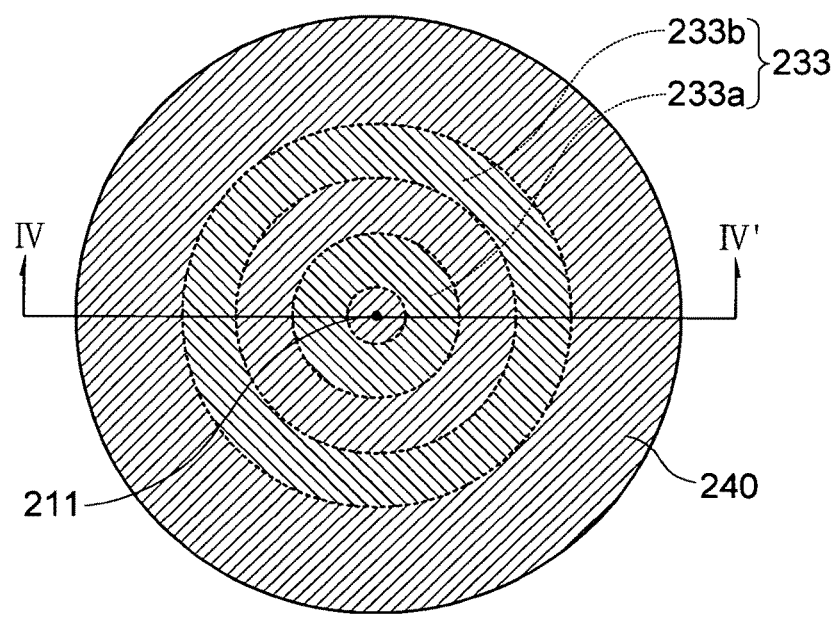

[FIG. 17]
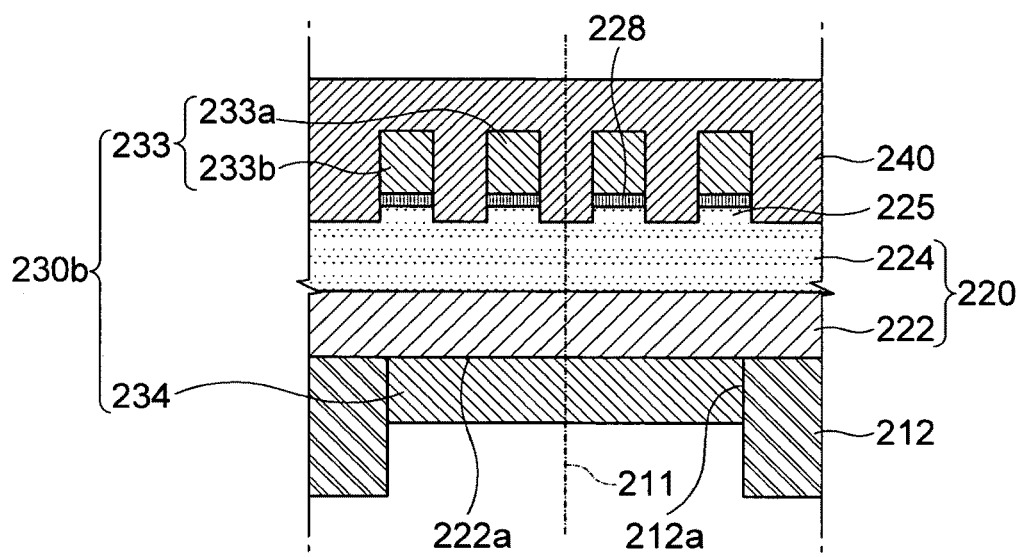

SEMICONDUCTOR DEVICE AND METHOD FOR MANUFACTURING OF THE SAME

CROSS-REFERENCE TO RELATED APPLICATIONS

This application claims the benefit of Korean Patent Application No. 10-2009-0084599 filed with the Korea Intellectual Property Office on Sep. 8, 2009, the disclosure of which is incorporated herein by reference.

BACKGROUND OF THE INVENTION

1. Field of the Invention

The present invention relates to a semiconductor device; and, more particularly, to a semiconductor device having a Schottky diode structure, and a method for manufacturing the same.

2. Description of the Related Art

In general, an active device of semiconductor devices is used to configure a circuit, such as an amplifier, a voltage regulator, a current regulator, an oscillator, a logic gate, and so on. A diode of active devices is widely used as a detecting device, a rectifying device, and a switching device. As for a typical diode, a voltage regulator diode, a variable capacitance diode, a photo diode, a Light Emitting Diode (LED), a zener diode, a gunn diode, a Schottky diode, and so on are exemplified.

The Schottky diode of the exemplified diodes uses Schottky junction generated when a metal comes into contact with semiconductor. The Schottky diode can implement high-speed switching operation and low forward voltage driving. The nitride-based semiconductor device like the Schottky diode has a Schottky contact as an anode electrode, and an ohmic contact as a cathode electrode. However, in the Schottky diode with such a structure, there exists a trade-off relation between satisfaction of low on-voltage and on-current and reduction of a reverse leakage current. Thus, it is difficult to develop a nitride-based semiconductor device capable of operating at a low on-voltage and reducing a reverse leakage current.

SUMMARY OF THE INVENTION

The present invention has been proposed in order to overcome the above-described problems and it is, therefore, an object of the present invention to provide a semiconductor device operable at a low on-voltage and a method for manufacturing the same.

Further, another object of the present invention is to provide a semiconductor device for reducing a reverse leakage current and a method for manufacturing the same.

Further, another object of the present invention is to provide a semiconductor device for increasing a breakdown current and a method for manufacturing the same.

Further, another object of the present invention is to provide a semiconductor device having a high forward current and a method for manufacturing the same.

In accordance with one aspect of the present invention to achieve the object, there is provided a semiconductor device including: a base substrate; a first semiconductor layer which is disposed on the base substrate and has a front surface and a rear surface opposite to the front surface; first ohmic electrodes disposed on the front surface of the first semiconductor layer; a second ohmic electrode disposed on the rear surface of the first semiconductor layer; a second semiconductor layer interposed between the first semiconductor layer and the first ohmic electrodes; and a Schottky electrode part which covers the first ohmic electrodes on the front surface of the first semiconductor layer.

The base substrate has a ring shape surrounding the second ohmic electrode.

The base substrate has recesses exposing the rear surface of the first semiconductor layer, and the second ohmic electrode is provided to be bonded to the first semiconductor layer within the recesses.

The first ohmic electrode has a plurality of ohmic contact pillars with an island-shaped cross section, and the ohmic contact pillars and the Schottky electrode part is configured in a prominence and depression structure in which they are engaged with one another up and down.

The first ohmic electrode has a plurality of ohmic contact pillars with the island-shaped cross section, and the ohmic contact pillars are disposed to be in a grid configuration within the Schottky electrode part.

The first ohmic electrode has at least one electrode with a ring-shaped cross section.

The first ohmic electrode shares a center of the semiconductor layer and has first and second electrodes with mutually different diameters.

The Schottky electrode part is extended to inside of the semiconductor layer, and has a bottom surface with a height lower than that of a top surface of the second semiconductor layer.

The first semiconductor layer includes: a lower layer adjacent to the base substrate; and an upper layer having an impurity concentration lower than that of the lower layer, and the second semiconductor layer has an impurity concentration higher than that of the upper layer.

The first ohmic electrode and the Schottky electrode part are formed of metallic material different from each other, the first ohmic electrode is bonded to the second semiconductor layer to thereby come into ohmic contact with the second semiconductor layer, the second ohmic electrode is bonded to the rear surface of the first semiconductor layer to thereby come into ohmic contact with the rear surface of the first semiconductor layer, and the Schottky electrode part is bonded to the front surface of the second semiconductor layer adjacent to the first ohmic electrode to thereby come into Schottky contact with the front surface of the second semiconductor layer.

The first ohmic electrode and the Schottky electrode part are formed of metallic material different from each other, and The Schottky electrode part comprises: first bonding portions which are bonded to the second semiconductor layer to thereby come into ohmic contact with the second semiconductor layer, and a second bonding portion bonded to the first semiconductor layer to thereby come into Schottky contact with the first semiconductor layer.

The Schottky electrode part is extended to inside of the semiconductor layer, and has the bottom surface with a height lower than that of the bottom surface of the second semiconductor layer.

In accordance with other aspect of the present invention to achieve the object, there is provided a semiconductor device including: a base substrate; a first semiconductor layer which is disposed on the base substrate and has a front surface and a rear surface opposite to the front surface; first ohmic electrodes which are disposed on the front surface of the first semiconductor layer and has a plurality of ohmic contact pillars with an island-shaped cross section; a second ohmic electrode which is disposed on the rear surface of the first semiconductor layer; a second semiconductor layer which is interposed between the first semiconductor layer and the first ohmic electrodes; and a Schottky electrode part which has first bonding portions bonded to the first ohmic electrodes, and second bonding portions bonded to the first semiconductor layer, wherein a depletion region is provided to permit or block a current flow to the second ohmic electrodes from the Schottky electrode part and the first ohmic electrodes, the depletion region being generated within the first semiconductor layer when the semiconductor layer is bonded to the second bonding portions.

The Schottky electrode part covers the ohmic contact pillars on the front surface of the first semiconductor layer, thereby achieving a prominence and depression structure in which the Schottky electrode part is engaged with the first ohmic contacts up and down.

When the semiconductor device is driven at a forward voltage equal to or higher than an on-voltage of the Schottky diode, the depletion region is provided to permit a current flow to the second ohmic electrode from the Schottky electrode part and the first ohmic electrodes.

When the semiconductor device is driven at a forward voltage lower than the on-voltage of the Schottky diode, the depletion region is provided to block a current flow to the second ohmic electrode from the Schottky electrode part.

When the semiconductor device is driven at a reverse voltage, the depletion region is provided to block a current flow to the second ohmic electrode from the Schottky electrode part and the first ohmic electrodes.

In accordance with other aspect of the present invention to achieve the object, there is provided a method for manufacturing a semiconductor device including the steps of: preparing a base substrate; forming a first semiconductor layer having a front surface and a rear surface opposite to the front surface, on the base substrate; forming first ohmic electrodes on the front surface of the first semiconductor layer; forming a second semiconductor layer interposed between the first semiconductor layer and the first ohmic electrodes; forming a second ohmic electrode on the rear surface of the first semiconductor layer; and forming a Schottky electrode part which covers the first ohmic electrodes, on the front surface of the first semiconductor layer.

The step of forming the second ohmic electrode includes the steps of: forming recesses exposing the rear surface of the first semiconductor layer on the base substrate; and forming a metallic film bonded to the first semiconductor layer within the recesses.

The step of forming the first ohmic electrodes includes a step of forming a plurality of ohmic contact pillars with an island-shaped cross section, and the ohmic contact pillars have recesses formed on regions, remaining after excluding regions of the first semiconductor layer where the first ohmic electrodes are to be formed.

The step of forming the first ohmic electrodes includes a step forming first and second electrodes provided to be in an annual ring shape, on the first semiconductor layer, and the first and second electrodes have recesses formed on regions, remaining after excluding regions of the first semiconductor layer where the first ohmic electrodes are to be formed.

The method further includes a step of forming protrusions protruded upward from the top surface of the first semiconductor layer, wherein the step of forming the second semiconductor layer, the first ohmic electrodes, and the protrusions is achieved by performing the same photoresist etching process.

The step of forming the first semiconductor layer includes the steps of: forming a lower layer having a high impurity concentration, on the base substrate; and forming an upper layer having a low impurity concentration lower than that of the lower layer, and the step of forming the second semiconductor layer includes a step of forming a semiconductor film having an impurity concentration higher than that of the upper layer.

The step of forming the upper layer includes a step of performing an epitaxial-growth process that uses the lower layer as a seed layer, and the step of forming the second semiconductor layer comprises a step of performing at least one of the epitaxial growth process that uses the upper layer as a seed layer, a chemical vapor deposition process, and a physical vapor deposition process.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a view showing a semiconductor device in accordance with one embodiment of the present invention;

FIG. 2 is a cross-sectional view taken along a line I-I' of FIG. 1;

FIGS. 3A to 3C are views showing operation states of the semiconductor device shown in FIG. 1, respectively;

FIGS. 4A to 4E are views showing methods for manufacturing the semiconductor device 100 in accordance with an embodiment of the present invention, respectively;

FIG. 5 is a view showing one modified example of a semiconductor device in accordance with one embodiment of the present invention;

FIG. 6 is a view showing other modified example of a semiconductor device shown in accordance with one embodiment of the present invention;

FIG. 7 is a view showing other modified example of a semiconductor device shown in accordance with one embodiment of the present invention;

FIG. 8 is a view showing other modified example of a semiconductor device shown in accordance with one embodiment of the present invention;

FIG. 9 is a view showing other modified example of a semiconductor device shown in accordance with one embodiment of the present invention;

FIG. 10 is a cross-sectional view taken along a line III-III' FIG. 9;

FIG. 11 is a plane-view showing a semiconductor device in accordance with other embodiment of the present invention;

FIG. 12 is a cross-sectional view taken along a line III-III' of FIG. 11;

FIGS. 13A to 13C are views showing operation states of the semiconductor device shown in FIGS. 11 and FIG. 12, respectively;

FIGS. 14A to 14D are views showing methods for manufacturing the semiconductor device 100 in accordance with other embodiment of the present invention, respectively;

FIG. 15 is a view showing one modified example of a semiconductor device in accordance with other embodiment of the present invention;

FIG. 16 is a view showing other modified example of a semiconductor device shown in accordance with other embodiment of the present invention; and FIG. 17 is a cross-sectional view taken along a line IV-IV' of FIG. 16.

DETAILED DESCRIPTION OF THE PREFERABLE EMBODIMENTS

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Preferred embodiments of the invention will be described below with reference to cross-sectional views, which are exemplary drawings of the invention. The exemplary drawings may be modified by manufacturing techniques and/or tolerances. Accordingly, the preferred embodiments of the invention are not limited to specific configurations shown in the drawings, and include modifications based on the method of manufacturing the semiconductor device. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

Hereinafter, a detailed description will be given of a semiconductor device and a method for manufacturing the same in accordance with embodiments of the present invention, with reference to accompanying drawings.

FIG. 1 is a view showing a semiconductor device in accordance with one embodiment of the present invention, and FIG. 2 is a cross-sectional view taken along a line I-I' of FIG. 1.

Referring to FIGS. 1 and 2, the semiconductor device 100 may include a base substrate 110, a first semiconductor layer 120, an ohmic electrode part 130, and a Schottky electrode part 140.

The base substrate 110 may be a plate used for formation of the semiconductor device having a Schottky diode structure. For example, the base substrate 110 may be a semiconductor substrate. As for the base substrate 110, at least one of a silicon substrate, a silicon carbide substrate, and a sapphire substrate may be exemplified.

The first semiconductor layer 120 may be disposed on the base substrate 110, and may provide a current flow path to inside thereof. For example, the first semiconductor layer 120 may include a lower layer 122 and an upper layer 124. The lower layer 122 may be a semiconductor layer having a higher impurity concentration than that of the upper layer 124. For example, the lower layer 122 may be an N-type semiconductor film having a relatively high impurity concentration, and the upper layer 124 may be an N-type semiconductor film having a relatively low impurity concentration. Meanwhile, a buffering film (not shown) may be further provided between the base substrate 110 and the lower layer 122 so as to solve problems caused by lattice mismatch generated between the base substrate 110 and the lower layer 122.

The ohmic electrode part 130 may include first ohmic electrodes 132 and a second ohmic electrode 134. The first ohmic electrodes 132 may be disposed on a central region A1 of the first semiconductor layer 120. The first ohmic electrode 132 may include at least one of ohmic contact pillars having an island-shaped cross section. For example, the first ohmic electrode 132 may have a plurality of ohmic contact pillars with an island-shaped cross section. Each of the first ohmic contact pillars may have a rectangular-shaped cross section. However, the first ohmic contact pillars may have a circular cross section. The ohmic contact pillars may be disposed to be in a grid configuration as shown in FIG. 1.

The second ohmic electrode 134 may be formed on edge regions A2 of the upper layer 124. The second ohmic electrode 134 may be disposed on edge regions A2 of the upper layer 124 so that it can surround the first ohmic electrodes 132. Thus, the second ohmic electrode 134 may be generally formed in a ring shape. Also, the second ohmic electrode 134 may be disposed to be spaced apart from the first ohmic electrodes 132.

Meanwhile, the second semiconductor layer 128 may be interposed between the first semiconductor layer 120 and the first ohmic electrodes 132. The second semiconductor layer 128 may be a semiconductor film having a relatively higher impurity concentration than that of the first semiconductor layer 120. For example, the second semiconductor layer 128 may be an N-type semiconductor film having a relatively higher impurity concentration than that of the first semiconductor layer 120. The first ohmic electrodes 132 are bonded to the second semiconductor layer 128 to thereby come into ohmic contact with the second semiconductor layer 128.

The Schottky electrode part 140 may be provided to cover the first ohmic electrodes 132. For example, the Schottky electrode part 140 may be provided on the central region A1 of the upper layer 124 so that it can entirely cover all ohmic contact pillars of the first ohmic electrodes 132. Thus, the Schottky electrode part 140 and the ohmic contact pillars may have a prominence and depression structure in which they are engaged with each other up and down. The Schottky electrode part 140 may have first bonding portions 142 bonded to the first ohmic electrodes 132, and second bonding portions 144 bonded to the first semiconductor layer 120 adjacent to the first ohmic electrodes 132. A depletion region DR may be formed within the first semiconductor layer 120 adjacent to the second bonding portions 144.

Herein, the Schottky electrode part 140 may be extended to inside of the first semiconductor layer 120. For example, the second bonding portions 144 of the Schottky electrode part 140 may be extended to inside of the upper layer 124, and may be disposed to be spaced apart from the lower layer 122. Thus, the Schottky electrode part 140 may have a bottom surface height lower than that of a top surface of the second semiconductor layer 128. To this end, the recesses 126 may be provided in the upper layer 124 of the first semiconductor layer 120. The recesses 126 may be formed by depressing regions excluding regions where the first ohmic electrodes 132 are formed on the upper layer 124. Thus, the upper layer 124 may have protrusions 125 having an upward protruded structure formed on the upper layer 124, and the first ohmic electrodes 132 may be disposed on the protrusions 125.

The semiconductor device 100 may further include a field plate 150. The field plate 150 may be disposed on the first semiconductor layer 120 between the second ohmic electrode 134 and the Schottky electrode part 140. In this case, a part of external side portions 152 of the field plate 150 may be provided to cover internal corners of a top surface of the second ohmic electrode 134, and a part of internal side portions 154 of the field plate 150 may be provided to be covered by the edge portions 144 of the Schottky electrode part 140.

The field plate 150 can provide an effect of distributing an electric field concentrated on corner portions of the Schottky electrode part 140 and the ohmic electrode part 130.

In the semiconductor device 100 having the same structure, each of the first ohmic electrodes 132 are bonded to the second semiconductor layer 128 in the central region A1 to thereby come into ohmic contact with each other. The second ohmic electrode 134 is bonded to the upper layer 124 in the edge regions A2 to thereby come into ohmic contact with each other. The Schottky electrode part 140 is bonded to the upper layer 124 of the central region A1 adjacent to the first ohmic electrodes 132 to thereby come into Schottky contact with each other. Herein, the Schottky electrode part 140 may be used as an anode electrode, and the second ohmic electrode 134 may be used as a cathode electrode.

Meanwhile, the ohmic electrode part 130 and the Schottky electrode part 140 may be formed of various materials. For example, the first ohmic electrodes 132 and the second ohmic electrode 134 may be formed of the same metallic material, and the Schottky electrode part 140 may be formed of metallic material different from those of the first and second ohmic electrodes 132 and 134. For example, the first and second ohmic electrodes 132 and 134 may be formed of a metallic material composed of at least one metal element of Al, Mo, Au, Ni, Pt, Ti, Pd, Ir, Rh, Co, W, Ta, Cu, and Zn. On the contrary, the Schottky electrode part 140 may be formed of a material composed of one or more metal elements different from that of the ohmic electrode part 130.

Continuously, a detailed description will be given of various operation states of the semiconductor device in accordance with one embodiment of the present invention having been described with reference to FIGS. 1 and 2.

FIGS. 3A to 3C are views showing operation states of the semiconductor device shown in FIG. 1, respectively. FIG. 3A is a view showing an operation state of the semiconductor device when driven at a forward voltage equal to or higher than an on-voltage of the Schottky diode. Referring to FIG. 3A, when the semiconductor device 100 in accordance with one embodiment of the present invention is driven at a first forward voltage equal to or higher than the on-voltage of the Schottky diode, a depletion region (DR1) generated where the first semiconductor layer 120 and the Schottky electrode part 140 are joined together may be relatively reduced. Thus, in the semiconductor device 100, a current may flow through a first current path CP1 and a second current path CP2, wherein the first current path CP1 passes through the firs semiconductor layer 120 from the second bonding portions 144 of the Schottky electrode part 140, and the second current path CP2 passes through the first and second semiconductor layers 120 and 128 from the first ohmic electrodes 132. In this case, since forward currents of the semiconductor device 100 are increased, it is possible to operate the semiconductor device 100 even at a low on-voltage.

FIG. 3B is a view showing an operation state of the semiconductor device when driven at a forward voltage lower than an on-voltage of the Schottky diode. Referring to FIG. 3B, when the semiconductor device 100 in accordance with one embodiment of the present invention is driven at a second forward voltage lower than the on-voltage of the Schottky diode, a depletion region DR2 generated where the second semiconductor layer 120 and the Schottky electrode part 140 are joined together may be more expanded than the depletion region DR1 corresponding to a case where the semiconductor device 100 is driven at the first forward voltage as described in FIG. 3A. Such the expanded depletion region DR2 may be wide enough to block a current flow between the first semiconductor layer 120 and the Schottky electrode part 140. However, the second forward voltage may be controlled such that the depletion region DR2 fails to block the second current path CP2. Thus, in the semiconductor device 100, a current may flow through the second current path CP2 alone.

FIG. 3C is a view showing an operation state of the semiconductor device when driven at a reverse voltage. Referring to FIG. 3C, when the semiconductor device 100 is driven at the reverse voltage, a depletion region D3 may be more expanded to block the first and second current paths, indicated by reference numerals CP1 and CP2 of FIG. 3A, in comparison with the depletion region DR2 shown in FIG. 3B. Such the depletion region DR3 blocks all current flows passing through the first and second current paths CP1 and the CP2.

As described above, when the semiconductor device 100 is driven in the forward direction, a current may flow to the second ohmic electrode 134 by the first ohmic electrodes 132 positioned below the Schottky electrode part 140 even in a state where the driving voltage is lower than the on-voltage of the Schottky diode, simultaneously while the current may flow through the first ohmic electrodes 132 and the Schottky, electrode part 140 in a state where the driving voltage is higher than the on-voltage of the Schottky diode. Thus, since the semiconductor device 100 may increase forward currents, it can be operated even at a low driving voltage. Also, when the semiconductor device 100 is driven in the reverse direction, the depletion region DR3 generated by the Schottky electrode part 140 blocks a current flow passing through the first and second semiconductor layers 120 and 128, thereby stably blocking a current flow.

Hereinafter, a description will be given of a method for manufacturing the semiconductor device in accordance with one embodiment of the present invention. Herein, the repeated description for the semiconductor device will be omitted or simplified.

FIGS. 4A to 4C are views showing methods for manufacturing the semiconductor device 100 in accordance with an embodiment of the present invention, respectively.

Referring to FIG. 4A, the base substrate 110 may be prepared. For example, a step of preparing the base substrate 110 may include a step of preparing a semiconductor substrate. The step of preparing the base substrate 110 may include a step of preparing at least one of a silicon substrate, a silicon carbide substrate, and a sapphire substrate.

A lower layer 122 and a pre-upper layer 123 may be sequentially formed on the base substrate 110. The step of forming the first semiconductor layer 120 may be achieved by epitaxial-growing the lower layer 122 by using the base substrate 110 as a seed layer, and then epitaxial-growing the pre-upper layer 123 by using the lower layer 122 as a seed layer.

The second semiconductor layer 128 may be formed. For example, a step of forming the second semiconductor layer 128 may include a step of forming the semiconductor film having a relatively higher impurity concentration than that of the pre-upper layer 123, on the pre-upper layer 123. For example, the step of forming the second semiconductor layer 128 may include a step of epitaxial-growing the semiconductor material having impurity concentration higher than that of the upper layer 124 by using the upper layer 124 as a seed layer. As for another example, the step of forming the pre-second semiconductor layer may include a step of depositing the semiconductor film having an impurity concentration higher than that of the upper layer 124, on the upper layer 123.

On the pre-upper layer 123 and the pre-second semiconductor layer, the recesses 126 may be formed. The step of forming the recesses 126 may include a step of: forming the first photoresist pattern PR1 exposing the first metal film of regions excluding regions where the first ohmic electrodes, indicated by reference numeral 132 of FIG. 4C, are to be formed, as well as the edge regions A2, on a resulting material formed with the pre-second semiconductor layer 128; a step of performing an etching process which exposes the pre-upper layer 123 by using the first photoresist pattern PR1 as an etching mask; and a step of removing the first photoresist pattern PR1. Thus, on the pre-upper layer 123, the protrusions 125 extended from the top surface are provided, and the second semiconductor layer 128 may selectively remain on the protrusions 125.

As for an epitaxial growth process for forming the pre-upper layer 123 and the pre-second semiconductor layer, at least one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process may be used. Furthermore, as for another process for forming the pre-upper layer 123 and the pre-second semiconductor layer, any one of a chemical vapor deposition process and a physical vapor deposition process may be used.

Referring to FIG. 4B, edge regions A2 of the first semiconductor layer 120 may be etched. For example, a second photoresist pattern PR2 for exposing edge regions A2 may be formed on the resulting material formed with the recesses 126, and then an etching process may be performed where the second photoresist pattern PR2 is used as an etching mask. Thus, the first semiconductor layer 120 may be formed which includes a lower layer 122, and the upper layer 124, wherein the lower layer 122 covers all surfaces of the base substrate 110 and the upper layer 124 has a depression 124a exposing the lower layer 122 on the edge regions A2 of the first semiconductor layer 120.

Referring to FIG. 4C, the ohmic electrode part 130 may be formed on the semiconductor layer 120. For example, a first metal film may be formed on the upper layer 124. A step of forming the first metal film may include a step of forming a metal film, which is composed of at least one of Au, Ni, Pt, Ti, Al, Pd, Ir, Rh, Co, W, Mo, Ta, Cu, and Zn, in a conformal manner, on the upper layer 124. Thereafter, a third photoresist pattern PR3 exposing the first metal film on the regions, excluding regions where the first ohmic electrodes 132 are to be formed among the middle regions A3, and the middle region A1, may be formed on the first metal film. Then, after the first metal film is etched by using the third photoresist pattern PR3 as an etching mask, it is possible to remove the third photoresist pattern PR3. Thus, the first ohmic electrodes having a plurality of ohmic contact pillars disposed to be in a lattice configuration on the central region A1, and the second ohmic electrode 134 having a ring shape formed along the edge regions A2 may be formed on the first semiconductor layer 120. Herein, since the first ohmic electrodes 132 and the second ohmic electrode 134 are simultaneously formed in the same etching process, they may be formed of the same metallic material. For example, the first ohmic electrodes 132 and the second ohmic electrode 134 may be formed in an in-situ scheme. Meanwhile, a process of planarizing the first metal film may be added before the first metal film is etched.

Referring to FIG. 4D, the field plate 150 may be formed. For example, an insulating film which covers all surfaces of the resulting material formed with the ohmic electrode part 130 may be formed in a conformal manner, and the fourth photoresist pattern PR4 may be formed on the insulating film. The fourth photoresist pattern PR4 can expose remaining region B1 including a part of the edge regions A2 and a part of the middle regions A3 of the first semiconductor layer 120. Then, the insulating film is etched by using the fourth photoresist pattern PR4 as an etching mask, and then the fourth photoresist pattern PR4 may be removed. The field plate 150 may be formed that covers the second ohmic electrode 134 and the first semiconductor layer 120 exposed to the middle regions A2. In this case, external side portions 152 of the field plate 150 may be provided to cover a part of the edges of the top surface of the second ohmic electrode 134. In addition, internal side portions 154 of the field plate 150 may be provided to be spaced apart from the first ohmic electrodes 132 on the middle regions A2.

Referring to FIG. 4E, the Schottky electrode part 140 may be formed that covers the first ohmic electrodes 132. For example, the step of forming the Schottky electrode part 140 may include a step of forming the second metal film that covers the resulting material formed with ohmic electrode part 130, and a step of forming the fifth photoresist pattern PR5 on the second metal film. The fifth photoresist pattern PR5 can expose a part of the edge regions A2 and the middle regions A3 of the first semiconductor layer 120. Thereafter, it is possible to perform an etching process which uses the fifth photoresist pattern PR5 as an etching mask, thereby forming the Schottky electrode part 140 which is spaced apart from the ohmic electrode 134 and entirely covers the first ohmic electrodes 132. In this case, the Schottky electrode part 140 may be formed so that it can cover internal side portions 154 of the field plate 150. Thus, it is possible to distribute an electric field concentrated on external corners of the Schottky electrode part 140.

Hereinafter, a description will be given of various modified examples of the semiconductor device in accordance with other embodiment of the present invention. The repeated description for the same components between the above-described semiconductor device and semiconductor devices in accordance with various modified embodiments will be omitted or simplified. Since those skilled in the art can analogize operation processes of the modified examples to be described from the operation states of the semiconductor device having been described with reference to FIGS. 3A and 3C, the description for operation processes of the modified examples will be omitted. Also, since those skilled in the art can analogize manufacturing methods of the modified examples to be described from the manufacturing methods of the semiconductor device having been described with reference to FIGS. 4A and 4E, the description for manufacturing methods of the modified examples will be omitted.

FIG. 5 is a view showing one modified example of the semiconductor device in accordance with one embodiment of the present invention. Referring to FIG. 5, the semiconductor device 100a in accordance with one modified embodiment of the present invention may include a base substrate 110, a first semiconductor layer 120a, a second semiconductor layer 128, an ohmic electrode part 130, a Schottky electrode part 140, and a field plate 150.

The first semiconductor layer 120a may include a lower layer 122 and an upper layer 124a, wherein the lower layer 122 is disposed to be adjacent to the base substrate 110, and the upper layer 124a is formed on lower layer 122. The ohmic electrode part 130 may be disposed on the upper layer 124a. The ohmic electrode part 130 may include the first ohmic electrodes 132 which are provided with a plurality of ohmic contact pillars with an island-shaped cross section on the central region A1, and a second ohmic electrode 134 having a ring shape on edge regions thereof. The Schottky electrode part 140 may be formed to entirely cover the first ohmic electrodes 132. Thus, the ohmic electrode pillars of the first ohmic electrodes 132 are engaged with the Schottky electrode part 140 to thereby achieve a prominence and depression structure. The field plate 150 may be provided that mostly covers corner portions of the Schottky electrode part 140 and the second ohmic electrode 134 on the middle regions A3.

Meanwhile, the ohmic electrode part 130 may be disposed on the first and second protrusions 125 and 127 formed on the first semiconductor layer 120. For example, the first ohmic electrodes 132 may be disposed on the protrusions 125 extended upward from the upper layer 124a in the central region A1. The second ohmic electrode 134 may be disposed on the second protrusions 127 extended upward from the upper layer 124a in the edge regions A2. Herein, the second semiconductor layer 128 may be interposed between the first protrusions 125 and the first ohmic electrodes 132, and between the second protrusions 127 and the second ohmic electrode 134. The semiconductor device 100a may have a structure in which the second ohmic electrode 134 is disposed on the second protrusions 127 of the first semiconductor layer 120a. In this case, metal films for formation of the first semiconductor layer 120, the second semiconductor layer 128, and the ohmic electrode part 130 on the base substrate 110 may be sequentially formed, and then a photoresist etching process may be performed once, thereby forming the first and second ohmic electrodes 132 and 134 at the same time. Thus, a method for manufacturing the semiconductor device 100a may be relatively simplified.

FIG. 6 is a view showing other modified example of the semiconductor device in accordance with one embodiment of the present invention. Referring to FIG. 6, the semiconductor device 100b in accordance with one modified embodiment of the present invention may include a base substrate 110b, a second semiconductor layer 128, an ohmic electrode part 130b, a Schottky electrode part 140, and a field plate 150. The ohmic electrode part 130b may be deposed on the second semiconductor layer 128 interposed on the base substrate 110b. The ohmic electrode part 130b may include the first ohmic electrodes 132 which are provided with a plurality of ohmic contact pillars with island-shaped cross sections on the central region A1 of the base substrate 110b, and the second ohmic electrode 134 having a ring shape formed along the edge regions A2 of the base substrate 110b. The Schottky electrode part 140 covers the first ohmic electrodes 132 to thereby achieve a prominence and depression structure in which the Schottky electrode part 140 is engaged with the ohmic electrode pillars up and down. The field plate 150 may be disposed between the second ohmic electrode 134 and the Schottky electrode part 140 on the middle regions A3 of the base substrate 110b.

Meanwhile, the base substrate 110b may be a semiconductor substrate. For example, the base substrate 110b may be an N-type semiconductor film having a relatively lower impurity concentration than that of the second semiconductor layer 128. In addition, the base substrate 110b may be formed of a material with a high resistivity. For example, the base substrate 110b may be an N-type semiconductor film having a low impurity concentration, and the second semiconductor layer 128 may be an N-type semiconductor film having a relatively higher impurity concentration than that of the base substrate 110b.

Unlike the above-described semiconductor devices 100 and 100a, the semiconductor device 100b provides a base substrate 110 corresponding to a semiconductor film having a low impurity concentration, so that the semiconductor device 100b is not required to have a separate semiconductor layer between the base substrate 110 and the second semiconductor layer 128 formed thereon. For example, in a method for manufacturing the semiconductor device 100b, a process (e.g., epitaxial-growth process, chemical vapor deposition process, and a physical vapor deposition, and so on) of forming a separate semiconductor layer (e.g., first semiconductor layers 120 and 120a shown in FIGS. 2 and 5) may be omitted.

FIG. 7 is a view showing other modified example of the semiconductor device in accordance with one embodiment of the present invention. Referring to FIG. 7, the semiconductor device 100c may include a base substrate 110, a first semiconductor layer 120, an ohmic electrode part 130c, a Schottky electrode part 140, and a field plate 150. The base substrate 110 may have a front surface, and a rear surface opposite to the front surface. The first semiconductor layer 120 may include an upper layer 124 and a lower layer 122 sequentially stacked on the base substrate 110, wherein the upper layer 124 has a lower impurity concentration than that of the lower layer 122. The ohmic electrode part 130c may be disposed on the base substrate 110 after the second semiconductor layer 128 with a higher impurity concentration that that of the upper layer 124 is interposed. The ohmic electrode part 130c may include the first ohmic electrodes 132 which are provided with a plurality of ohmic contact pillars with island-shaped cross sections on the central region A1 of the base substrate 110b. The Schottky electrode part 140 covers the first ohmic electrodes 132 to thereby achieve a prominence and depression structure in which the Schottky electrode part 140 is engaged with the ohmic electrode pillars up and down. The field plate 150 may be disposed between the second ohmic electrode 134c and the Schottky electrode part 140 on the middle regions A3 of the base substrate 110b.

Meanwhile, the ohmic electrode part 130b may further include a second ohmic electrode 134c disposed on a rear surface of the base substrate 110. The second ohmic electrode 134c may be formed of the same metallic material as the first ohmic electrodes 132. The second ohmic electrode 134c may be used as a cathode electrode of the semiconductor device 100c. In this case, the Schottky electrode part 140 may be used an anode electrode of the semiconductor device 100c. The semiconductor device 100c has a structure in which the first ohmic electrodes 132 are disposed on the front surface of the base substrate 110 and the second ohmic electrode 134c is disposed on the rear surface of the base substrate 110. Thus, within the semiconductor device 100c, there is generated a structure in which a vertical current flow in up and down directions.

FIG. 8 is a view showing other modified example of the semiconductor device in accordance with one embodiment of the present invention. Referring to FIG. 8, the semiconductor device 100d may include a base substrate 110, a first semiconductor layer 120, an ohmic electrode part 130d, a Schottky electrode part 140d, and a field plate 150d. The first semiconductor layer 120 may include a lower layer 122 and an upper layer 124 sequentially stacked on the front surface of the base substrate 110, wherein the upper layer 124 has a lower impurity concentration than that of the lower layer 122. The ohmic electrode part 130d may be disposed on edge regions A2 of the first semiconductor layer 120. The Schottky electrode part 140d may be disposed on the central region A3 of the first semiconductor layer 120. Herein, the protrusions 125 protruded upward from the top surface of the first semiconductor layer 120 may be formed on the central region A1 of the first semiconductor layer 120, and the second semiconductor layer 128 having a higher impurity concentration than that of the upper layer 124 may be disposed on the protrusions 125. Thus, a pillar configuration may be achieved between the protrusions 125 and the second semiconductor layer 128. The Schottky electrode part 140*d* covers the central region A1 to thereby achieve a prominence and depression structure in which they are engaged with one another up and down. The field plate 150 may be disposed between the second ohmic electrode 134 and the Schottky electrode part 140 on the middle regions A3 of the base substrate 110*b*.

In the semiconductor device 100*d* with the same structure, the Schottky electrode part 140*d* may have first bonding portions 142*d* bonded to the second semiconductor layer 128, and second bonding portions 144*d* bonded to the first semiconductor layer 120. Herein, the first bonding portions 142*d* come into ohmic contact with the second semiconductor layer 128, and the second bonding portions 144*d* come into Schottky contact with the upper layer 124 of the first semiconductor layer 120. The semiconductor device 100*d* is provided with the Schottky electrode part 140*d*, thereby performing functions of a Schottky diode and an ohmic diode. Thus, the central region A1 may have a structure in which there is no separate ohmic electrode within the Schottky electrode part 140*d*. Thus, it is possible to form the semiconductor 100*d* which can perform the operations described with reference to FIGS. 3A to 3C only through a process of forming the Schottky electrode part 140*d* which covers the protrusions 125 and the second semiconductor layer 128, without having to perform a process of forming a separate ohmic electrode on the protrusions 125 of the central region A1 in a method for manufacturing the semiconductor device 100*d*.

FIG. 9 is a view showing other modified example of a semiconductor device in accordance with one embodiment of the present invention, and FIG. 10 is a cross-sectional view taken along a line II-II' of FIG. 9.

Referring to FIGS. 9 and 10, the semiconductor device 100*e* may include a base substrate 110, a first semiconductor layer 120, an ohmic electrode part 130*e*, a Schottky electrode part 140, and a field plate 150. The first semiconductor layer 120 may include a lower layer 122 and an upper layer 124 sequentially stacked on the front surface of the base substrate 110, wherein the upper layer 124 has a lower impurity concentration than that of the lower layer 122. The ohmic electrode part 130*e* may include a first ohmic electrode 133 disposed on the central region A1 of the first semiconductor layer 120 and the second ohmic electrode 134 disposed on the edge regions A2 of the first semiconductor layer 120. The Schottky electrode part 140 covers the first ohmic electrode 133 on the central region A1 to thereby achieve a prominence and depression structure in which they are engaged with one another up and down. The field plate 150 may be disposed on the middle regions A3.

Meanwhile, each of the first ohmic electrodes 133 may have a ring shape based on the center 111 of the first semiconductor layer 120. For example, the first ohmic electrodes 133 may include a first electrode 133*a* and a second electrode 133*b*. The first electrode 133*a* and a second electrode 133*b* have a ring shape sharing the center 111 of the semiconductor layer 120, and the second electrode 133*b* may have a diameter bigger than that of the first electrode 133*a*. Thus, the first ohmic electrode 133 and the second ohmic electrode 134 are formed to be in an annual ring configuration on the first semiconductor layer 120. The second ohmic electrode 134 may have a ring shape based on the center 111 of the semiconductor layer 120. The second ohmic electrode 134 may have a ring shape surrounding the first ohmic electrode 133 on the edge regions A2.

Hereinafter, a detailed description will be given of a semiconductor device and a method for manufacturing the same in accordance with other embodiments of the present invention.

FIG. 11 is a plane-view showing a semiconductor device in accordance with other embodiment of the present invention, and FIG. 12 is a cross-sectional view taken along a line III-III' of FIG. 11.

Referring to FIGS. 11 and 12, the semiconductor device 200 may include a base substrate 212, a first semiconductor layer 220, an ohmic electrode part 230, and a Schottky electrode part 240. The base substrate 212 may be a plate used for formation of the semiconductor device having a Schottky diode structure. For example, the base substrate 212 may be a semiconductor substrate. As for the base substrate 212, at least one of a silicon substrate, a silicon carbide substrate, and a sapphire substrate may be exemplified.

The first semiconductor layer 220 may be disposed on the base substrate 212, and may provide a current flow path to inside thereof. For example, the first semiconductor layer 220 may include a lower layer 222 and an upper layer 224. The lower layer 222 may be a semiconductor layer having a higher impurity concentration than that of the upper layer 224. For example, the lower layer 222 may be an N-type semiconductor film having a relatively high impurity concentration, and the upper layer 224 may be an N-type semiconductor film having a relatively low impurity concentration.

Meanwhile, a buffering film (not shown) may be further provided between the base substrate 212 and the lower layer 222 so as to solve problems caused by lattice mismatch generated between the base substrate 212 and the lower layer 222.

The ohmic electrode part 230 may include first ohmic electrodes 232 and a second ohmic electrode 234. The first ohmic electrodes 232 may be disposed on a central region A1 of the front surface 222*a* of the first semiconductor layer 220. The first ohmic electrode 232 may include at least one of ohmic contact pillars having an island-shaped cross section. For example, the first ohmic electrode 232 may have a group composed of a plurality of ohmic contact pillars with an island-shaped cross section. Each of the first ohmic contact pillars may have a rectangular-shaped cross section. Also, the first ohmic contact pillars may have a circular cross section. The ohmic contact pillars may be disposed to be in a grid configuration, as shown in FIG. 1. Meanwhile, the second ohmic electrode 234 may be disposed on the central region A1 of the rear surface opposite to the front surface 222*a* of the first semiconductor layer 220. The second ohmic electrode 234 may be provided to directly be in contact with the lower layer 222. To this end, a trench 212*a* for exposing the rear surface 222*b* of the lower layer 222 may be formed on the base substrate 212.

The Schottky electrode part 240 may be provided to cover the first ohmic electrodes 232. For example, the Schottky electrode part 240 may be provided so that it can entirely cover all ohmic contact pillars of the first ohmic electrodes 232. Thus, the Schottky electrode part 240 and the ohmic contact pillars may have a prominence and depression structure in which they are engaged with each other up and down. The Schottky electrode part 240 may have first bonding portions 242 bonded to the first ohmic electrodes 232, and second bonding portions 244 bonded to the first semiconductor layer 220 adjacent to the second ohmic electrodes 232. A depletion region DR may be formed within the first semiconductor layer 220 adjacent to the second bonding portions 244.

Herein, the Schottky electrode part 240 may be extended to inside of the first semiconductor layer 220. For example, the second bonding portions 244 of the Schottky electrode part 240 may be extended to inside of the upper layer 224 of the first semiconductor layer 220, and may be disposed to be spaced apart from the lower layer 222. Thus, the Schottky electrode part 240 may have a bottom surface with a height lower than that of a top surface of the second semiconductor layer 218. To this end, the recesses 226 may be provided in the upper layer 224 of the first semiconductor layer 220. The recesses 226 may be formed by depressing regions excluding regions where the first ohmic electrodes 232 are formed on the upper layer 224. Thus, the upper layer 224 may have an upward protruded structure formed on the upper layer 224 (hereinafter, referred to as "protrusions 225"), and the first ohmic electrodes 232 may be disposed on the protrusions 225.

In the semiconductor device 200 with the same structure, each of the first ohmic electrodes 232 is bonded to the second semiconductor layer 218 in the central region A1 to thereby come into ohmic contact with each other. The second ohmic electrode 234 is bonded to the upper layer 224 in the edge regions A2 to thereby come into ohmic contact with each other. The Schottky electrode part 240 is bonded to each of the first ohmic electrodes 232 and the upper layer 224 of the central region A1 to thereby come into Schottky contact with one another. Also, the Schottky electrode part 240 may be used as an anode electrode, and the second ohmic electrode 234 may be used as a cathode electrode.

Meanwhile, the ohmic electrode part 230 and the Schottky electrode part 240 may be formed of various materials. For example, the first ohmic electrodes 232 and the second ohmic electrode 234 may be formed of the same metallic material, and the Schottky electrode part 240 may be formed of metallic material different from those of the first and second ohmic electrodes 232 and 234. For example, the first and second ohmic electrodes 232 and 234 may be formed of a metallic material composed of at least one metal element of Al, Mo, Au, Ni, Pt, Ti, Pd, Ir, Rh, Co, W, Ta, Cu, and Zn. On the contrary, the Schottky electrode part 240 may be formed of a material composed of one or more metal elements different from that of the ohmic electrode part 230.

Continuously, a detailed description will be given of various operation states of the semiconductor device 200 in accordance with other embodiment of the present invention having been described with reference to FIGS. 11 and 12.

FIGS. 13A to 13C are views showing operation states of the semiconductor device shown in FIGS. 11 and 12, respectively.

FIG. 13A is a view showing an operation state of the semiconductor device when driven at a forward voltage equal to or higher than an on-voltage of the Schottky diode. Referring to FIG. 13A, when the semiconductor device 200 in accordance with other embodiment of the present invention is driven at a first forward voltage equal to or higher than the on-voltage of the Schottky diode, a depletion region (DR1) generated where the first semiconductor layer 220 and the Schottky electrode part 240 are joined together may be relatively reduced. Thus, in the semiconductor device 200, a current may flow through a first current path CP1 and a second current path CP2, wherein the first current path CP1 passes through the firs semiconductor layer 220 from the second bonding portions 244 of the Schottky electrode part 240, and the second current path CP2 passes through the first and second semiconductor layers 220 and 218 from the first ohmic electrodes 232. In this case, since forward currents of the semiconductor device 200 are increased, it is possible to operate the semiconductor device 200 even at a low on-voltage.

FIG. 13B is a view showing an operation state of the semiconductor device when driven at a forward voltage lower than an on-voltage of the Schottky diode. Referring to FIG. 13B, when the semiconductor device 200 in accordance with other embodiment of the present invention is driven at a second forward voltage lower than the on-voltage of the Schottky diode, a depletion region DR2 generated where the second semiconductor layer 220 and the Schottky electrode part 240 are joined together may be more expanded than a case where the semiconductor device 100 is driven at the first forward voltage as described in FIG. 13A. Such the expanded depletion region DR2 may be wide enough to block a current flow between the first semiconductor layer 220 and the Schottky electrode part 240. However, the second forward voltage may be controlled such that the depletion region DR2 fails to block the second current path CP2. Thus, in the semiconductor device 200, a current may flow through the second current path CP2 alone.

FIG. 13C is a view showing an operation state of the semiconductor device when driven at a reverse voltage. Referring to FIG. 13C, when the semiconductor device 200 is driven at the reverse voltage, a depletion region D3 may be more expanded to block the first and second current paths, indicated by reference numerals CP1 and CP2 of FIG. 13A, in comparison with the depletion region DR2 shown in FIG. 13B. Such the depletion region DR3 blocks all current flows passing through the first and second current paths CP1 and the CP2.

As described above, when the semiconductor device 200 is driven in the forward direction, a current may flow to the second ohmic electrode 234 by the first ohmic electrodes 232 positioned below the Schottky electrode part 240 even in a state where the driving voltage is lower than the on-voltage of the Schottky diode, simultaneously while the current may flow through the first ohmic electrodes 232 and the Schottky electrode part 240 in a state where the driving voltage is higher than the on-voltage of the Schottky diode. Thus, since the semiconductor device 200 may increase forward currents, it can be operated even at a low driving voltage. Also, when the semiconductor device 200 is driven in the reverse direction, the depletion region DR3 generated by the Schottky electrode part 240 allows the 2DEG to be disconnected, thereby stably blocking a current flow.

Hereinafter, a description will be given of a method for manufacturing the semiconductor device in accordance with other embodiment of the present invention. Herein, the repeated description for the semiconductor device associated with embodiments illustrated with reference to FIGS. 11 and 12 will be omitted or simplified.

FIGS. 14A to 14D are views showing methods for manufacturing the semiconductor device in accordance with other embodiment of the present invention, respectively.

Referring to FIG. 14A, the base substrate 210 may be prepared. A step of preparing the base substrate 210 may include a step of preparing a semiconductor substrate. The step of preparing the pre-base substrate 210 may include a step of preparing at least one of a silicon substrate, a silicon carbide substrate, and a sapphire substrate.

A first semiconductor layer 220, a second semiconductor formation film 227, and a first metal film 219 may be sequentially formed on the front surface of the pre-base substrate 210. The step of forming the first semiconductor layer 220 may include a step of forming a lower layer 222 on the pre-base substrate 210, and a step of forming an upper layer 224 on the lower layer 222. A step of forming the second semiconductor formation layer 227 may include a step of forming the semiconductor film having a relatively higher impurity concentration than that of the upper layer 224, on the pre-base substrate 210. For example, the step of forming the first semiconductor layer 220 may be achieved by epitaxial-growing the lower layer 222 by using the base substrate 212 as a seed layer, and then epitaxial-growing the upper layer 224 by using the lower layer 222 as a seed layer. Also, the step of forming the second semiconductor formation film 227 may be achieved by performing an epitaxial-growth process that uses the upper layer 224 as a seed layer. As for an epitaxial growth process for forming the first semiconductor layer 220 and the second semiconductor formation layer 227, at least one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process may be used. Furthermore, as for another process for forming the first semiconductor layer 220 and the second semiconductor formation layer 227, any one of a chemical vapor deposition process and a physical vapor deposition process may be used.

The first photoresist pattern PR1 for exposing a partial region of the first metal film 219 may be formed on the first metal film 219. The first photoresist pattern PR1 can expose the first metal film 219 on regions where the first ohmic electrodes, indicated by reference numeral 232 of FIG. 14B, and edge regions A2 in the central region A1 of the pre-base substrate 210.

Referring to FIG. 14B, the first ohmic electrodes 232 and the second semiconductor layer 218 may be formed. In a step of forming the first ohmic electrodes 232 and the second semiconductor layer 218, recesses 226 for exposing the upper layer 224 of the first semiconductor layer 220 may be formed by using the first photoresist pattern PR1 as an etching mask. Thus, on the first semiconductor layer 220, the protrusions 225 extended upward from the upper layer 224, and the first ohmic electrodes 232 disposed on the protrusions 225 may be formed. Herein, the protrusions 225 and the first ohmic electrodes 232 may be formed in a lattice configuration.

Referring to FIG. 14C, by removing a partial region of the pre-base substrate 210, the base substrate 212 may be formed. A step of forming the base substrate 212 may include a step of forming the second photoresist pattern PR2 for exposing the central region A1 of the rear surface of the pre-base substrate 210, and a step of forming the second recesses 212a for exposing the rear surface 222b of the lower layer 222 of the first semiconductor layer 220 by using the second photoresist pattern PR2 as an etching mask.

Referring to FIG. 14D, on the rear surface 222b of the first semiconductor layer 222, the second ohmic electrode 134 may be formed. A step of forming the second ohmic electrode 134 may include a step of forming the second metal film buried in the second recesses 212a formed on the base substrate 212. The second metal film may be a metal film with the same material as the first metal film for formation of the first ohmic electrodes 132. Also, the Schottky electrode part 140 may be formed. A step of forming the Schottky electrode part 140 may include a step of forming a third metal film which covers the first ohmic electrodes 132, on the front surface of the first semiconductor layer 220. The third metal film may be a metal film with a material different from that of the first and second metal films. Thus, on the front surface of the base substrate 212, the Schottky electrode part 140 has a prominence and depression structure in which it is engaged with the first ohmic electrodes 232 and the second ohmic electrode 234 may be formed on the rear surface of the base substrate 212.

Hereinafter, a description will be given of various modified examples of the semiconductor device in accordance with other embodiment of the present invention. The repeated description for the same components between the above-described semiconductor device and semiconductor devices in accordance with various modified embodiments will be omitted or simplified. Since those skilled in the art can analogize operation processes of the modified examples to be described from the operation states of the semiconductor device having been described with reference to FIGS. 13A and 13C, the description for operation processes of the modified examples will be omitted. Also, since those skilled in the art can analogize manufacturing methods of the modified examples to be described from the manufacturing methods of the semiconductor device having been described with reference to FIGS. 14A and 14D, the description for manufacturing methods of the modified examples will be omitted.

FIG. 15 is a view showing one modified example of the semiconductor device in accordance with other embodiment of the present invention. Referring to FIG. 15, the semiconductor device 200a may include a base substrate 212, a first semiconductor layer 220, an ohmic electrode part 230a, and a Schottky electrode part 240a. The first semiconductor layer 220 may include an upper layer 224 and a lower layer 222 sequentially stacked on the front surface of the base substrate 212, wherein the upper layer 224 has a lower impurity concentration than that of the lower layer 222. On the top surface of the upper layer 224, a plurality of protrusions 225 is formed. On the protrusions 225, the second semiconductor layer 218 having a higher impurity concentration than that of the upper layer 224 may be disposed. The ohmic electrode part 230a may be disposed on the rear surface 212a of the first semiconductor layer 200. In addition, the ohmic electrode part 230a may be disposed in such a manner to be bonded to the rear surface 212a in the recesses 212a formed on the base substrate 212. The Schottky electrode part 240a may be formed to cover all surface of the first semiconductor layer 220, thereby achieving a prominence and depression structure in which it is engaged with the protrusions 225.

In the semiconductor device 200a with the same structure, the Schottky electrode part 240a may have first bonding portions 242a bonded to the second semiconductor layer 218, and second bonding portions 244a bonded to the upper layer 224 of the first semiconductor layer 220. Herein, the first bonding portions 242a come into ohmic contact with the second semiconductor layer 218, and the second bonding portions 244a come into Schottky contact with the upper layer 224 of the first semiconductor layer 220. The semiconductor device 200a having the same structure may have a structure in which there is no separate ohmic electrode within the Schottky electrode part 140d (e.g., first ohmic electrodes 232 of FIG. 12). Thus, it is not necessary to perform a separate process for formation of ohmic electrodes within the Schottky electrode part 140d.

FIG. 16 is a view showing another modified example of the semiconductor device in accordance with other embodiment of the present invention. FIG. 17 is a cross-sectional view taken along a line IV-IV' shown in FIG. 16.

Referring to FIGS. 16 and 17, the semiconductor device 200b may include a base substrate 212, a first semiconductor layer 220, an ohmic electrode part 230b, and a Schottky electrode part 240. The first semiconductor layer 220 may include an upper layer 224 and a lower layer 222 sequentially stacked on the front surface of the base substrate 212, wherein the upper layer 224 has a lower impurity concentration than that of the lower layer 222. On the top surface of the upper layer 224, a plurality of protrusions 225 is formed. On the protrusions 225, the second semiconductor layer 218 having a higher impurity concentration than that of the upper layer 224 may be disposed. The ohmic electrode part 230b may be disposed on the rear surface 222a of the first semiconductor layer 200. In addition, the ohmic electrode part 230b may be disposed in such a manner to be bonded to the rear surface 222a in the recesses 212a formed on the base substrate 212. The Schottky electrode part 240 may be formed to cover all surface of the first semiconductor layer 220, thereby achieving a prominence and depression structure in which it is engaged with the protrusions 225. Meanwhile, the first and second ohmic electrodes 232a and 234a may have a ring shape based on the center 211 of the semiconductor layer 210. For example, the first and second ohmic electrodes 232a and 234a may have a ring shape sharing the center 111 and have diameters bigger than those of the first ohmic electrodes 232a. Thus, the first and second ohmic electrodes 232a and 234a may be formed in an annual ring configuration on the semiconductor layer 220.

In the case where the semiconductor device of the present invention is driven in a forward direction, when a driving voltage is higher than an on-voltage of the Schottky diode, a current flows through an ohmic electrode and Schottky electrode part at the same time. Further, a current flow by the first ohmic electrode positioned below the Schottky electrode part even if the driving voltage is lower than the on-voltage of the Schottky diode. Therefore, in the semiconductor device, forward currents are increased, and thus it is possible to perform operation even at a low driving voltage.

When the semiconductor device of the present invention is driven in a reverse direction, a 2DEG is allowed to be disconnected by a depletion region generated by the Schottky electrode part to thereby stably block a current flow, which results in high reverse breakdown voltage.

In a method for manufacturing the semiconductor device, forward currents are increased and reverse leakage currents are reduced, so that it is possible to improve power converting efficiency of the semiconductor device, as well as operation speed of the semiconductor device.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A semiconductor device comprising:
    a base substrate;
    a first semiconductor layer which is disposed on the base substrate and has a front surface and a rear surface opposite to the front surface;
    first ohmic electrodes disposed on the front surface of the first semiconductor layer;
    a second ohmic electrode disposed on the rear surface of the first semiconductor layer;
    a second semiconductor layer interposed between the first semiconductor layer and the first ohmic electrodes; and
    a Schottky electrode part which covers the first ohmic electrodes on the front surface of the first semiconductor layer,
    wherein the Schottky electrode part is extended to into the first semiconductor layer, and a bottom surface of the Schottky electrode part is lower than a top surface of the second semiconductor layer.

2. The semiconductor device of claim 1, wherein the base substrate has a ring shape surrounding the second ohmic electrode.

3. The semiconductor device of claim 1, wherein the base substrate has recesses exposing the rear surface of the first semiconductor layer, and
    the second ohmic electrode is provided to be bonded to the first semiconductor layer within the recesses.

4. The semiconductor device of claim 1, wherein the first ohmic electrode has a plurality of ohmic contact pillars with an island-shaped cross section, and
    the ohmic contact pillars and the Schottky electrode part are configured in a prominence and depression structure in which they are engaged with one another up and down.

5. The semiconductor device of claim 1, wherein the first ohmic electrode has a plurality of ohmic contact pillars with the island-shaped cross section, and
    the ohmic contact pillars are disposed to be in a grid configuration within the Schottky electrode part.

6. The semiconductor device of claim 1, wherein the first ohmic electrode has at least one electrode with a ring-shaped cross section.

7. The semiconductor device of claim 5, wherein the first ohmic electrode shares a center of the semiconductor layer and has first and second electrodes with mutually different diameters.

8. The semiconductor device of claim 1, wherein the first semiconductor layer comprises:
    a lower layer adjacent to the base substrate; and
    an upper layer having an impurity concentration lower than that of the lower layer, and
    the second semiconductor layer has an impurity concentration higher than that of the upper layer.

9. The semiconductor device of claim 1, wherein the first ohmic electrode and the Schottky electrode part are formed of metallic material different from each other, the first ohmic electrode is bonded to the second semiconductor layer to thereby come into ohmic contact with the second semiconductor layer, the second ohmic electrode is bonded to the rear surface of the first semiconductor layer to thereby come into ohmic contact with the rear surface of the first semiconductor layer, and the Schottky electrode part is bonded to the front surface of the second semiconductor layer adjacent to the first ohmic electrode to thereby come into Schottky contact with the front surface of the second semiconductor layer.

10. The semiconductor device of claim 1, wherein the first ohmic electrode and the Schottky electrode part are formed of metallic material different from each other, and
    the Schottky electrode part comprises:
    first bonding portions which are bonded to the second semiconductor layer to thereby come into ohmic contact with the second semiconductor layer, and
    a second bonding portion bonded to the first semiconductor layer to thereby come into Schottky contact with the first semiconductor layer.

11. The semiconductor device of claim 1, wherein the bottom surface of the Schottky electrode part is lower than a bottom surface of the second semiconductor layer.

* * * * *